US012770847B2

(12) United States Patent
Maruko et al.

(10) Patent No.: US 12,770,847 B2
(45) **Date of Patent: *Oct. 20, 2026**

(54) SPUTTERING TARGET

(71) Applicant: FURUYA METAL CO., LTD., Tokyo (JP)

(72) Inventors: Tomohiro Maruko, Tokyo (JP); Yu Suzuki, Tokyo (JP); Shohei Otomo, Tokyo (JP); Hironobu Nakamura, Tokyo (JP)

(73) Assignee: FURUYA METAL CO., LTD, Tokyo (JP)

( * ) Notice: Subject to any disclaimer, the term of this patent is extended or adjusted under 35 U.S.C. 154(b) by 256 days.

This patent is subject to a terminal disclaimer.

(21) Appl. No.: 17/623,354

(22) PCT Filed: Jun. 26, 2020

(86) PCT No.: PCT/JP2020/025279

§ 371 (c)(1),
(2) Date: Dec. 28, 2021

(87) PCT Pub. No.: WO2021/019991

PCT Pub. Date: Feb. 4, 2021

(65) Prior Publication Data

US 2022/0275499 A1 Sep. 1, 2022

(30) Foreign Application Priority Data

Jul. 31, 2019 (JP) ................................ 2019-141696
Nov. 26, 2019 (JP) ................................ 2019-213592
(Continued)

(51) Int. Cl.
*H01J 37/34* (2006.01)
*B22F 3/10* (2006.01)
(Continued)

(52) U.S. Cl.
CPC ........ *H01J 37/3429* (2013.01); *C22C 1/0416* (2013.01); *C22C 1/047* (2023.01);
(Continued)

(58) Field of Classification Search
CPC ............. H01J 37/3429; C23C 14/3414; C22C 1/0416; C22C 21/00; C22C 30/00; C22C 28/00
See application file for complete search history.

(56) References Cited

U.S. PATENT DOCUMENTS 6,248,453 B1 * 6/2001 Watson .................. C22C 21/00 428/614
6,329,275 B1 12/2001 Ishigami et al.
(Continued)

FOREIGN PATENT DOCUMENTS

CN 104805406 A 7/2015
CN 106164329 A 11/2016
(Continued)

OTHER PUBLICATIONS

Machine Translation JP 2015096647 (Year: 2015).*
(Continued)

*Primary Examiner* — Michael A Band
(74) *Attorney, Agent, or Firm* — Ohlandt, Greeley and Perle, L.L.P.

(57) ABSTRACT

A sputtering target is a sputtering target including aluminum and either a rare earth element or a titanium group element or both a rare earth element and a titanium group element, and the sputtering target has a chlorine content of 100 ppm or less.

8 Claims, 7 Drawing Sheets

(30) Foreign Application Priority Data

| | | |
|---|---|---|
| Dec. 27, 2019 | (JP) | 2019-237867 |
| Dec. 27, 2019 | (JP) | 2019-237870 |
| Mar. 24, 2020 | (JP) | 2020-052166 |
| Jun. 18, 2020 | (JP) | 2020-105160 |
| Jun. 18, 2020 | (JP) | 2020-105165 |
| Jun. 18, 2020 | (JP) | 2020-105166 |

(51) Int. Cl.

| | |
|---|---|
| ***B22F 3/15*** | (2006.01) |
| ***C22C 1/04*** | (2023.01) |
| ***C22C 1/047*** | (2023.01) |
| ***C22C 14/00*** | (2006.01) |
| ***C22C 21/00*** | (2006.01) |
| ***C22C 29/16*** | (2006.01) |
| ***C23C 14/34*** | (2006.01) |

(52) U.S. Cl.
CPC .............. *C22C 21/00* (2013.01); *C22C 29/16* (2013.01); *C23C 14/3414* (2013.01); *B22F 3/10* (2013.01); *B22F 3/15* (2013.01); *B22F 2999/00* (2013.01); *C22C 14/00* (2013.01)

(56) References Cited

U.S. PATENT DOCUMENTS

| | | | | |
|---|---|---|---|---|
| 6,387,536 | B1 | 5/2002 | Takagi et al. | |
| 2002/0064949 | A1 | 5/2002 | Shah et al. | |
| 2003/0227068 | A1 | 12/2003 | Li et al. | |
| 2012/0000766 | A1 | 1/2012 | Teshigahara et al. | |
| 2017/0175252 | A1 | 6/2017 | Koido | |
| 2018/0261439 | A1* | 9/2018 | Myasnikov | C23C 14/3414 |
| 2019/0161851 | A1 | 5/2019 | Morii et al. | |
| 2022/0356558 | A1* | 11/2022 | Maruko | C22C 21/00 |

FOREIGN PATENT DOCUMENTS

| | | | |
|---|---|---|---|
| CN | 107841639 | A | 3/2018 |
| CN | 109161858 | A | 1/2019 |
| JP | H08134635 | A | 5/1966 |
| JP | 2000273623 | A | 10/2000 |
| JP | 200128348 | A | 1/2001 |
| JP | 2006-111970 | A | 4/2006 |
| JP | 201212673 | A | 1/2012 |
| JP | 2015-96647 | A | 5/2015 |
| JP | 2015096647 | A | 5/2015 |
| JP | 2015183244 | A | 10/2015 |
| WO | 2017213185 | A1 | 12/2017 |

OTHER PUBLICATIONS

International Preliminary Report on Patentability (IPRP) dated Feb. 1, 2022 for PCT Appl. No. PCT/JP2020/025279.
Indian Office Action dated Aug. 11, 2022 for Indian Appl. No. 202227010713.
Kano et al; "Enhancement of Piezoelectric Response in Scandium Aluminum Nitride Alloy Thin Films prepared by Dual Reactive Co-Sputtering"; Advanced Materials, vol. 17; 2012; p. 202-207.
Japanese Office Action dated Nov. 29, 2021 for Japanese Appl. No. 2020-105166.
Extended European Search Report dated Jul. 17, 2023 for European Appl. No. 20847766.1.
Korean Office Action dated Feb. 22, 2024 for Korean Application No. 10-2022-7000278.
2nd Chinese Office Action (with English translation) dated May 14, 2024 for Chinese Application No. 202080049429.3.
3rd Chinese Office Action (with English translation) dated Jul. 19, 2024 for Chinese Application No. 202080049429.3.

* cited by examiner

SPUTTERING TARGET

BACKGROUND

1. Field of the Disclosure

The present disclosure relates to a sputtering target suitable for forming a metal film or nitride film having good piezoelectric responsiveness in a piezoelectric element.

2. Discussion of the Background Art

As aging of population proceeds in the modern and the future society, decrease in the working population is predicted, and therefore, also in the manufacturing industry, automation is promoted using the Internet of Things (IoT). Also in the automobile industry, a shift is occurring to a society in which automobiles are manufactured that can be automatically operated not by a person but mainly by artificial intelligence (AI) or the like.

An important technology in automation and automatic operation is ultra-high-speed wireless communication, and high frequency filters are indispensable for ultra-high-speed wireless communication. For increase in the speed of wireless communication, a shift is scheduled from a frequency band 3.4 GHz used in conventional fourth generation mobile communication (4G) to frequency bands 3.7 GHz, 4.5 GHz, and 28 GHz used in fifth generation mobile communication (5G). When this shift occurs, it is technically difficult to use conventional surface acoustic wave (SAW) filters as high frequency filters. Therefore, change from surface acoustic wave filters to bulk acoustic wave (BAW) filters is occurring in the technology.

As a piezoelectric film in BAW filters and piezoelectric element sensors, an aluminum nitride film is mainly used. Aluminum nitride is known to have a high amplitude increase coefficient called a quality factor (Q factor), and is therefore used as a piezoelectric film. However, aluminum nitride cannot be used at a high temperature, and therefore nitride films containing an aluminum element and a rare earth element are promising for obtaining a piezoelectric element having high temperature resistance and a high Q factor.

As a sputtering target to form a nitride film containing an aluminum element and a rare earth element, a sputtering target is disclosed that includes an alloy of Al and Sc, contains from 25 atom % to 50 atom % of Sc, and has an oxygen content of 2,000 ppm by mass or less and a variation in Vickers hardness (Hv) of 20% or less (see, for example, Patent Literature 1). It is described that the sputtering target is produced through a melting step and further plastic working such as a forging step (see, for example, Patent Literature 1). Furthermore, Patent Literature 1 describes that the variation in the Sc content at a top surface of the target (TOP) and a bottom surface of the target (BTM) of the sputtering target is within the range of ±2 atom % (paragraphs 0040 to 0041 in the description).

Furthermore, in a method for manufacturing a sputtering target including an alloy of aluminum and a rare earth element, there is a technique in which a raw material is prepared that has an element ratio between aluminum and a rare earth element in a range satisfying that the obtained alloy target includes only two intermetallic compounds, an alloy powder of aluminum and the rare earth element is produced from the raw material with an atomization method, and from the obtained alloy powder, a sintered body to be an alloy target is prepared with a hot press method or a spark plasma sintering method under a vacuum atmosphere (see, for example, Patent Literature 2).

Furthermore, a $Sc_xAl_{1-x}N$ alloy is known to have a piezoelectric coefficient $d_{33}$ that extremely depends on the composition deviation in the Sc concentration (see, for example, FIG. 3 in Non Patent Literature 1).

CITATION LIST

Patent Literature

Patent Literature 1: WO 2017/213185 A
Patent Literature 2: JP 2015-96647 A

Non Patent Literature

Non Patent Literature 1: Kazuhiko KANO et al., DENSO TECHNICAL REVIEW Vol. 17, 2012, p. 202 to 207

SUMMARY

The Problems to be Solved by the Disclosure

In manufacture of an aluminum alloy, there is almost no range in which aluminum and an element to be added to aluminum become a complete solid solution because although aluminum has a low melting point of 660° C., the element to be added to aluminum has a very high melting point such as a melting point of 1,541° C. in the case of scandium, 1,522° C. in the case of yttrium, 1,668° C. in the case of titanium, 1,855° C. in the case of zirconium, and 2,233° C. in the case of hafnium, resulting in a difference in melting point between aluminum and the element to be added of 800° C. or more.

Therefore, if scandium is added in a large amount with respect to aluminum as in Patent Literature 1, the melting point is 1,400° C. or more in some compositions, and in such compositions, the degree of growth of the intermetallic compound varies due to the temperature unevenness during solidification after melting, so that it is difficult to produce a sputtering target having a uniform composition in an in-plane direction and a thickness direction of the sputtering target.

Furthermore, if a melting method is used and only an intermetallic compound is included as in Patent Literature 1, a very hard and brittle sputtering target is obtained, and even if an ingot is formed by melting, a crack or the like is likely to occur in the sputtering target during plastic working such as forging.

Furthermore, if a sputtering target is produced with a melting method as in Patent Literature 1, a precipitated phase grows greatly, and composition unevenness occurs in the in-plane direction and the thickness direction of the sputtering target, so that even if a thin film is formed by sputtering, the composition distribution of the obtained alloy thin film is unstable.

Although Patent Literature 1 describes that the variation in the Sc content at the TOP and the BTM of the sputtering target is within the range of ±2 atom %, it is also necessary to suppress the variation not only in the thickness direction but also in the in-plane direction in order to obtain the homogeneity of the formed film.

As particularly pointed out in FIG. 3 in Non Patent Literature 1, the characteristic may extremely change due to composition deviation, and therefore it is important to maintain a uniform composition in the in-plane direction and the thickness direction.

For solving a problem in production by a melting method, it is conceivable to reduce plastic working by, for example, eliminating the composition deviation between aluminum and a rare earth when the aluminum and the rare earth are in the form of a powder as in Patent Literature 2, or finishing sintering so that a sintered body has a form close to the final shape of the product. However, if contamination with impurities such as chlorine, fluorine, and oxygen is excessive, the chlorine, the fluorine, and the oxygen in the sputtering target are released by heating during film formation, so that abnormal discharge is likely to occur, and the orientation of the obtained film deteriorates, or particles are generated to lower the yield of a film.

Therefore, an object of the present disclosure is to provide a sputtering target in which contamination of the sputtering target with a chlorine element as an impurity is suppressed, and occurrence of abnormal discharge due to chlorine is suppressed in forming a thin film using the sputtering target and the formed thin film can have good orientation.

Solution to Solve the Problem

As a result of intensive studies to solve the above-described problems, the present inventors have found that the problem of contamination with a chlorine element can be suppressed by setting the concentration of a chlorine element as an impurity in a sputtering target to a predetermined value or less, and have completed the present invention. That is, the sputtering target according to the present invention is a sputtering target including aluminum and either a rare earth element or a titanium group element or both a rare earth element and a titanium group element, and the sputtering target has a chlorine content of 100 ppm or less. Forming a thin film using the sputtering target can suppress occurrence of abnormal discharge due to chlorine, and the formed thin film can have good orientation. Furthermore, by suppressing occurrence of abnormal discharge due to chlorine, it is possible for the formed thin film to have a good yield while generation of particles is suppressed.

The sputtering target according to the present invention preferably has a fluorine content of 100 ppm or less. Forming a thin film using the sputtering target can suppress occurrence of abnormal discharge due to fluorine, and the formed thin film can have good orientation. Furthermore, by suppressing occurrence of abnormal discharge due to fluorine, it is possible for the formed thin film to have a good yield while generation of particles is suppressed.

The sputtering target according to the present invention preferably has an oxygen content of 500 ppm or less. Forming a thin film using the sputtering target can suppress occurrence of abnormal discharge due to oxygen, and the formed thin film can have good orientation. Furthermore, by suppressing occurrence of abnormal discharge due to oxygen, it is possible for the formed thin film to have a good yield while generation of particles is suppressed.

In the sputtering target according to the present invention, an intermetallic compound including at least two elements selected from aluminum, a rare earth element, or a titanium group element is preferably present in the sputtering target. The variation in composition can be suppressed by reducing the number of sites of single aluminum, a single rare earth element, and a single titanium group element. The presence of the intermetallic compound in the target lessens the difference in sputtering rate between the metal elements, and thus reduces the composition unevenness in the obtained film.

In the sputtering target according to the present invention, the intermetallic compound may include one, two, three, or four kinds of intermetallic compounds being present in the sputtering target. The variation in composition can be suppressed by reducing the number of sites of single aluminum, a single rare earth element, and a single titanium group element. The presence of one or more kinds of the intermetallic compounds further lessens the difference in sputtering rate between the metal elements, and thus further reduces the composition unevenness in the obtained film.

In the sputtering target according to the present invention, at least one nitride of at least one element selected from aluminum, a rare earth element, or a titanium group element may be present in the sputtering target. In forming a nitride film of a piezoelectric element, the piezoelectric element can withstand a high temperature and can have a high Q factor.

In the sputtering target according to the present invention, the rare earth element is preferably at least one of scandium or yttrium. In forming a nitride film of a piezoelectric element, the piezoelectric element can withstand a high temperature and can have a high Q factor.

In the sputtering target according to the present invention, the titanium group element is preferably at least one of titanium, zirconium, or hafnium. In forming a nitride film of a piezoelectric element, the piezoelectric element can withstand a high temperature and can have a high Q factor.

The sputtering target according to the present invention preferably has a structure in which at least one of a material containing aluminum and a rare earth element, a material containing aluminum and a titanium group element, or a material containing aluminum, a rare earth element, and a titanium group element is present in an aluminum matrix, or a structure including at least a composite phase including either a phase consisting of a rare earth element and an inevitable impurity as metal species or a phase consisting of a titanium group element and an inevitable impurity as metal species or both a phase consisting of a rare earth element and an inevitable impurity as metal species and a phase consisting of a titanium group element and an inevitable impurity as metal species in an aluminum matrix. A sputtering target can be provided that has improved conductivity and, for example, improves productivity when a film is formed using a DC sputtering device.

Advantageous Effects of Disclosure

In the sputtering target of the present disclosure, contamination of the sputtering target with a chlorine element as an impurity can be suppressed, occurrence of abnormal discharge due to chlorine can be suppressed in forming a thin film using the sputtering target, and thus the formed thin film can have good orientation. Furthermore, by suppressing occurrence of abnormal discharge due to chlorine, it is possible for the formed thin film to have a good yield while generation of particles is suppressed.

DETAILED DESCRIPTION OF THE PREFERRED EMBODIMENT

Figure 1:
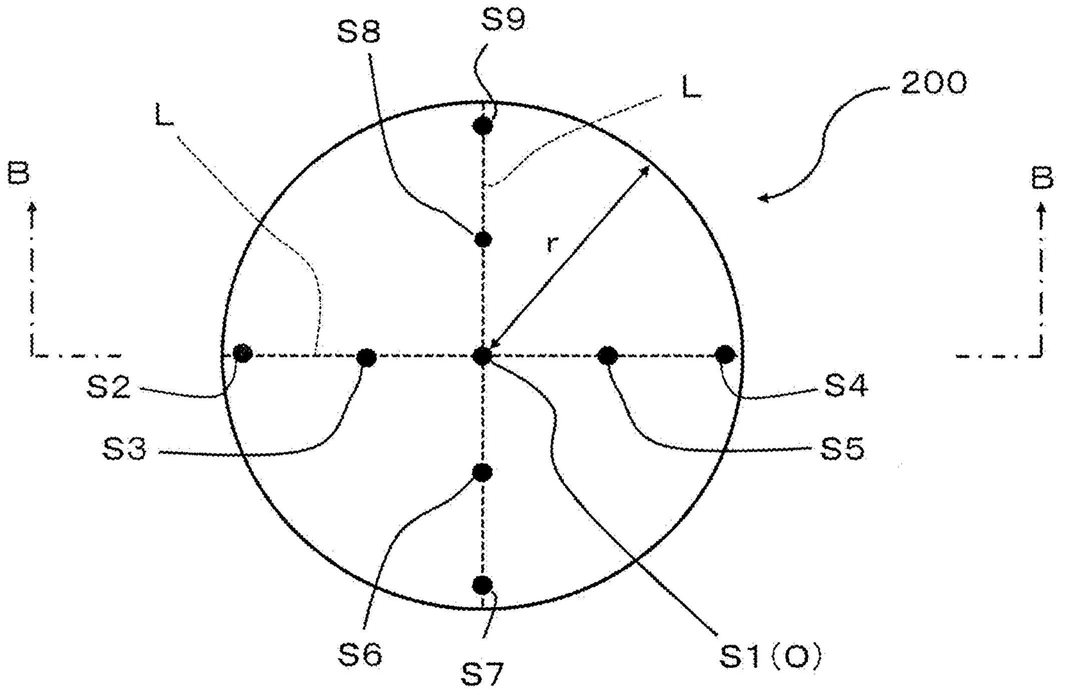
FIG. 1 is a schematic view showing measurement sites in composition analysis of a disk-shaped target in an in-plane direction of a sputter surface.

Hereinafter, the present invention will be described in detail with reference to embodiments, but the present invention is not construed as being limited to these descriptions. The embodiments may be variously modified as long as an effect of the present invention is exhibited.

A sputtering target according to the present embodiment is a sputtering target including aluminum and either a rare earth element or a titanium group element or both a rare earth element and a titanium group element, and the sputtering target has a chlorine content of 100 ppm or less, preferably 50 ppm or less, and more preferably 30 ppm or less. If the chlorine content is more than 100 ppm, chlorine in the sputtering target is released by heating during film formation, and as a result, the voltage applied to the sputtering target is not stabilized, abnormal discharge occurs, and the abnormal discharge causes generation of particles, reduction in the yield of the formed thin film, and poor orientation of the formed thin film, hence the chlorine content in the sputtering target is to be 100 ppm or less.

In the sputtering target according to the present embodiment, a fluorine content is preferably 100 ppm or less, more preferably 50 ppm or less, and still more preferably 30 ppm or less. If the fluorine content is more than 100 ppm, fluorine in the sputtering target is released by heating during film formation, and as a result, the voltage applied to the sputtering target is not stabilized, abnormal discharge occurs, and the abnormal discharge causes generation of particles, reduction in the yield of the formed thin film, and poor orientation of the formed thin film, hence the fluorine content in the sputtering target is preferably adjusted to 100 ppm or less.

In the sputtering target according to the present embodiment, an oxygen content is preferably 500 ppm or less, more preferably 300 ppm or less, and still more preferably 100 ppm or less. If the oxygen content is more than 500 ppm, oxygen in the sputtering target is released by heating during film formation, and as a result, the voltage applied to the sputtering target is not stabilized, abnormal discharge occurs, and the abnormal discharge causes generation of particles, reduction in the yield of the formed thin film, and poor orientation of the formed thin film, hence the oxygen content in the sputtering target is preferably adjusted to 500 ppm or less.

In the sputtering target according to the present embodiment, a carbon content is preferably 200 ppm or less, more preferably 100 ppm or less, and still more preferably 50 ppm or less. If the carbon content is more than 200 ppm, carbon is incorporated into a film being formed during sputtering, and a thin film having poor crystallinity is formed. Furthermore, if a strongly bound compound is formed on the surface of the target, the conductivity is impaired, particles are generated due to abnormal discharge, and the yield of a film deteriorates, so that the carbon content in the sputtering target is preferably adjusted to 200 ppm or less.

In the sputtering target according to the present embodiment, a silicon content is preferably 200 ppm or less, more preferably 100 ppm or less, and still more preferably 50 ppm or less. If the silicon content is more than 200 ppm, an oxide or nitride of silicon is formed during sputtering, abnormal discharge occurs from the oxide or nitride as a starting point, particles are generated, and the yield of the formed thin film deteriorates, so that the silicon content in the sputtering target is preferably adjusted to 200 ppm or less.

In the sputtering target according to the present embodiment, a difference between a composition of the sputtering target and a reference composition is within ±3%, preferably ±2% or less, and more preferably ±1% or less both in an in-plane direction of a sputter surface and in a thickness direction of the sputtering target under (Condition 1) or (Condition 2). Here, the reference composition is an average of compositions at 18 sites in total measured in accordance with (Condition 1) or (Condition 2). If the difference from the reference composition is more than ±3%, the sputtering rate may vary during film formation with the sputtering target, and when a piezoelectric film or the like of a piezoelectric element is formed, the piezoelectric film in each substrate may have a different piezoelectric characteristic, and even in the same substrate, each site in the piezoelectric film may have a different piezoelectric characteristic due to the different composition. Therefore, in order to suppress deterioration of the yield of a piezoelectric element, it is preferable to control the composition of the sputtering target in the in-plane direction of the sputter surface and in the target thickness direction so that the difference from the reference composition is within ±3%. If the sputtering target has a uniform composition in the in-plane direction and in the thickness direction, it is possible to suppress deterioration of the yield caused by change, resulting from composition deviation, in the characteristic such as the piezoelectric responsiveness when a thin film used in a piezoelectric element or the like is formed.

(Condition 1)

In-plane direction of the sputter surface: The sputtering target is a disk-shaped target having a center O and a radius of r, and the measurement sites for the composition analysis are 9 sites in total including, on imaginary crossing lines orthogonally crossing at the center O as an intersection, 1 site at the center O, 4 sites 0.45r away from the center O, and 4 sites 0.9r away from the center O.

Target thickness direction: A cross section including one of the imaginary crossing lines is formed, the cross section is a rectangle having a longitudinal length oft (that is, the target has a thickness of t) and a lateral length of 2r, and the measurement sites for the composition analysis are 9 sites in total including 3 sites, on a vertical transversal passing through the center O, at the center X and 0.45t away from the center X upward and downward (referred to as a point a, a point X, and a point b) and including, on the cross section, 2 sites 0.9r away from the point a toward the left and the right sides, 2 sites 0.9r away from the point X toward the left and the right sides, and 2 sites 0.9r away from the point b toward the left and the right sides.

(Condition 2)

In-plane direction of the sputter surface: The sputtering target has a rectangle shape having a longitudinal length of L1 and a lateral length of L2 (note that examples of the rectangle include a square in which L1 and L2 are equal and a rectangle obtained by developing the side surface of a cylindrical shape having a length J and a circumferential length K, and in the form of this rectangle, L2 corresponds to the length J, L1 corresponds to the circumferential length K, and the length J and the circumferential length K have a relationship of J>K, J=K, or J<K), and the measurement sites for the composition analysis are 9 sites in total including, on imaginary crossing lines orthogonally crossing at the center of gravity O as an intersection in a case where each line orthogonally crosses the side of the rectangle, 1 site at the center of gravity O, 2 sites away by a distance of 0.25L1 from the center of gravity O on the imaginary crossing line in the longitudinal direction, 2 sites away by a distance of 0.25L2 from the center of gravity O in the lateral direction, 2 sites away by a distance of 0.45L1 from the center of gravity O in the longitudinal direction, and 2 sites away by a distance of 0.45L2 from the center of gravity O in the lateral direction.

Target thickness direction: A cross section including one imaginary crossing line that is parallel to any one of the longitudinal side having a length of L1 and the lateral side having a length of L2 is formed, and in a case where the one is the lateral side having a length of L2, the cross section is a rectangle having a longitudinal length of t (that is, the target has a thickness of t) and a lateral length of L2, and the measurement sites for the composition analysis are 9 sites in total including 3 sites, on a vertical transversal passing through the center of gravity O, at the center X and 0.45t away from the center X upward and downward (referred to as a point a, a point X, and a point b) and including, on the cross section, 2 sites 0.45L2 away from the point a toward the left and the right sides, 2 sites 0.45L2 away from the point X toward the left and the right sides, and 2 sites 0.45L2 away from the point b toward the left and the right sides.

FIG. 1 is a schematic view showing measurement sites in composition analysis of a disk-shaped target in an in-plane direction of a sputter surface (hereinafter, also referred to as measurement sites), and the measurement sites in the sputtering target in the in-plane direction of the sputter surface under (Condition 1) will be described with reference to FIG. 1. In the case of a disk-shaped target, the radius is preferably 25 to 225 mm, and more preferably 50 to 200 mm. The thickness of the target is preferably 1 to 30 mm, and more preferably 3 to 26 mm. In the present embodiment, a larger target is expected to be more effective.

FIG. 1 shows a sputtering target 200 that is a disk-shaped target having a center O and a radius of r. The measurement sites are 9 sites in total including, on imaginary crossing lines (L) orthogonally crossing at the center O as an intersection, 1 site at the center O (S1), 4 sites 0.45r away from the center O (S3, S5, S6, and S8), and 4 sites 0.9r away from the center O (S2, S4, S7, and S9).

Figure 2:
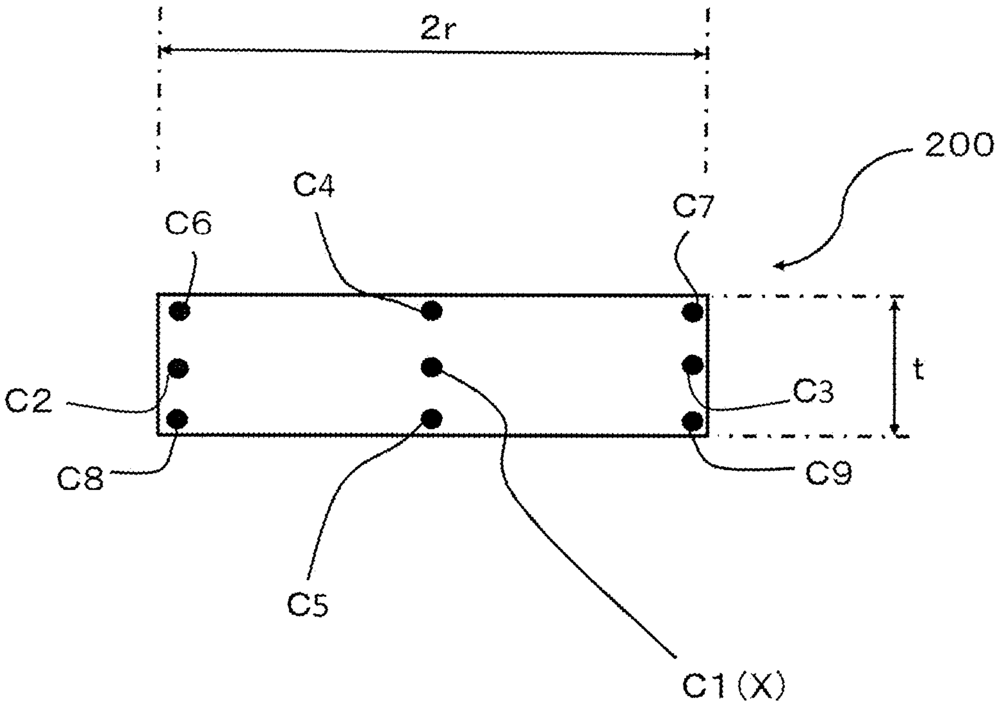
FIG. 2 is a schematic view showing measurement sites in composition analysis, in a target thickness direction, of the disk-shaped target illustrated in a B-B cross section.

FIG. 2 is a schematic view showing measurement sites in composition analysis, in a target thickness direction, of the disk-shaped target illustrated in the B-B cross section in FIG. 1, and the measurement sites in the sputtering target in the target thickness direction under (Condition 1) will be described with reference to FIG. 2.

In FIG. 2, the B-B cross section in FIG. 1 is a rectangle having a longitudinal length oft (that is, the target has a thickness of t) and a lateral length of 2r. The measurement sites are 9 sites in total including 3 sites, on a vertical transversal passing through the center O, at the center X (C1) and 0.45t away from the center X upward and downward (referred to as a point a (C4), a point X (C1), and a point b (C5)) and including, on the cross section, 2 sites 0.9r away from the point a toward the left and the right sides (C6 and C7), 2 sites 0.9r away from the point X toward the left and the right sides (C2 and C3), and 2 sites 0.9r away from the point b toward the left and the right sides (C8 and C9).

Figure 3:
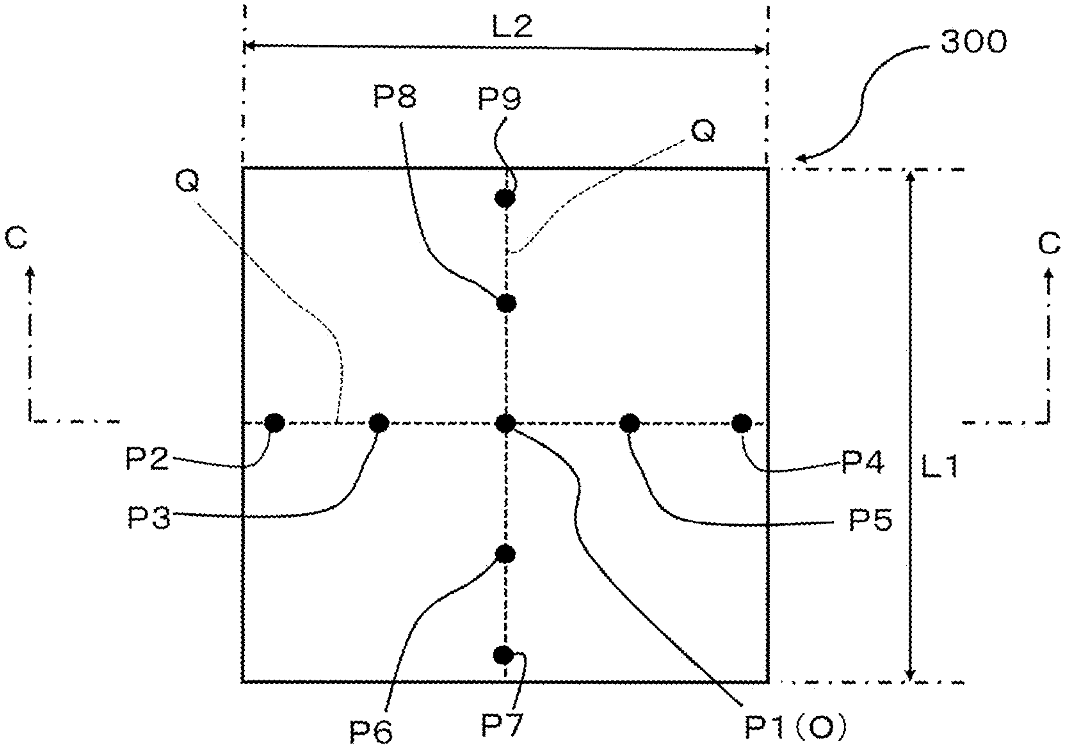
FIG. 3 is a schematic view showing measurement sites in composition analysis of a square plate-shaped target in an in-plane direction of a sputter surface.

FIG. 3 is a schematic view showing measurement sites in composition analysis of a square plate-shaped target in an in-plane direction of a sputter surface, and the measurement sites in the sputtering target in the in-plane direction of the sputter surface under (Condition 2) will be described with reference to FIG. 3. In the case of a rectangular or square target, the longitudinal length and the lateral length are preferably 50 to 450 mm, and more preferably 100 to 400 mm. The thickness of the target is preferably 1 to 30 mm, and more preferably 3 to 26 mm. In the present embodiment, a larger target is expected to be more effective.

A sputtering target 300 is a rectangular target having a longitudinal length of L1 and a lateral length of L2 (however, a square in which L1 and L2 are equal is included), and FIG. 3 illustrates a form in which the sputtering target 300 has the longitudinal length of L1 and the lateral length of L2 that are equal. The measurement sites are 9 sites in total including, on imaginary crossing lines (Q) orthogonally crossing at the center of gravity O as an intersection in a case where each line orthogonally crosses the side of the rectangle (or square), 1 site at the center of gravity O (P1), 2 sites away by a distance of 0.25L1 from the center of gravity O on the imaginary crossing line in the longitudinal direction (P6 and P8), 2 sites away by a distance of 0.25L2 from the center of gravity O in the lateral direction (P3 and P5), 2 sites away by a distance of 0.45L1 from the center of gravity O in the longitudinal direction (P7 and P9), and 2 sites away by a distance of 0.45L2 from the center of gravity O in the lateral direction (P2 and P4). In a case where the sputtering target is rectangular, L1 and L2 can be appropriately selected regardless of the length of each side.

Figure 4:
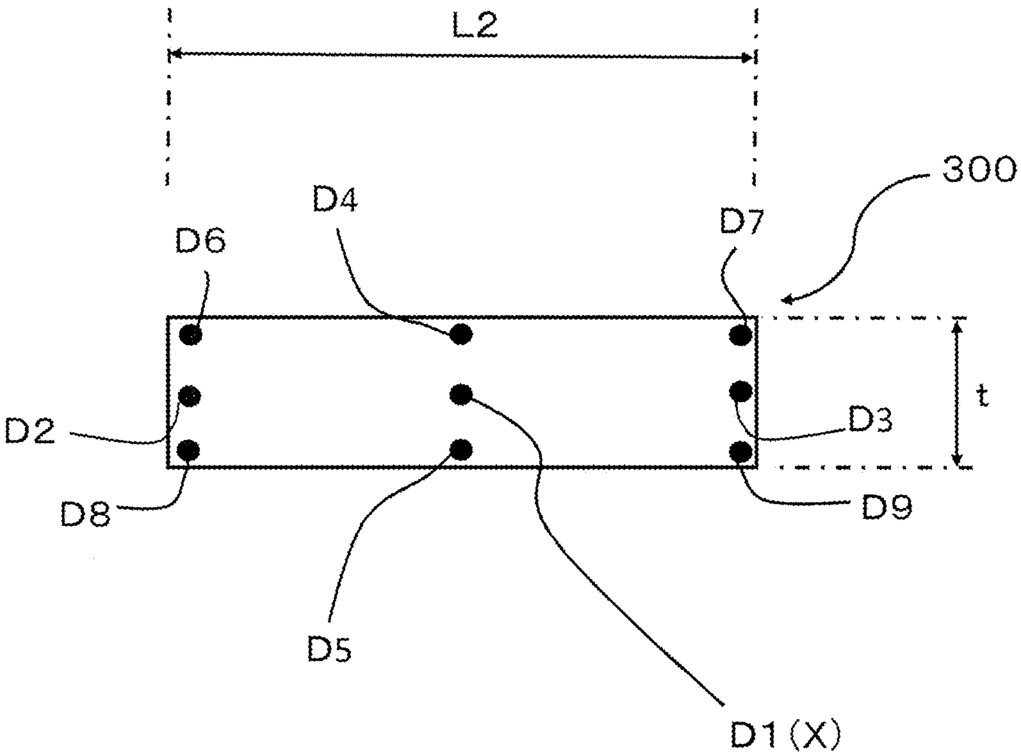
FIG. 4 is a schematic view showing measurement sites in composition analysis, in a target thickness direction, of the square plate-shaped target illustrated in a C-C cross section.

FIG. 4 is a schematic view showing measurement sites in composition analysis, in a target thickness direction, of the square plate-shaped target illustrated in the C-C cross section in FIG. 3, and the measurement sites in the sputtering target in the target thickness direction under (Condition 2) will be described with reference to FIG. 4.

In FIG. 4, the C-C cross section in FIG. 3 forms a cross section including a line that is parallel to the lateral side, the cross section is a rectangle having a longitudinal length of t (that is, the target has a thickness of t) and a lateral length of L2, and the measurement sites are 9 sites in total including 3 sites, on a vertical transversal passing through the center of gravity O, at the center X and 0.45t away from the center X upward and downward (referred to as a point a (D4), a point X (D1), and a point b (D5)) and including, on the cross section, 2 sites 0.45L2 away from the point a toward the left and the right sides (D6 and D7), 2 sites 0.45L2 away from the point X toward the left and the right sides (D2 and D3), and 2 sites 0.45L2 away from the point b toward the left and the right sides (D8 and D9).

(Cylindrical Sputtering Target)

Figure 5:
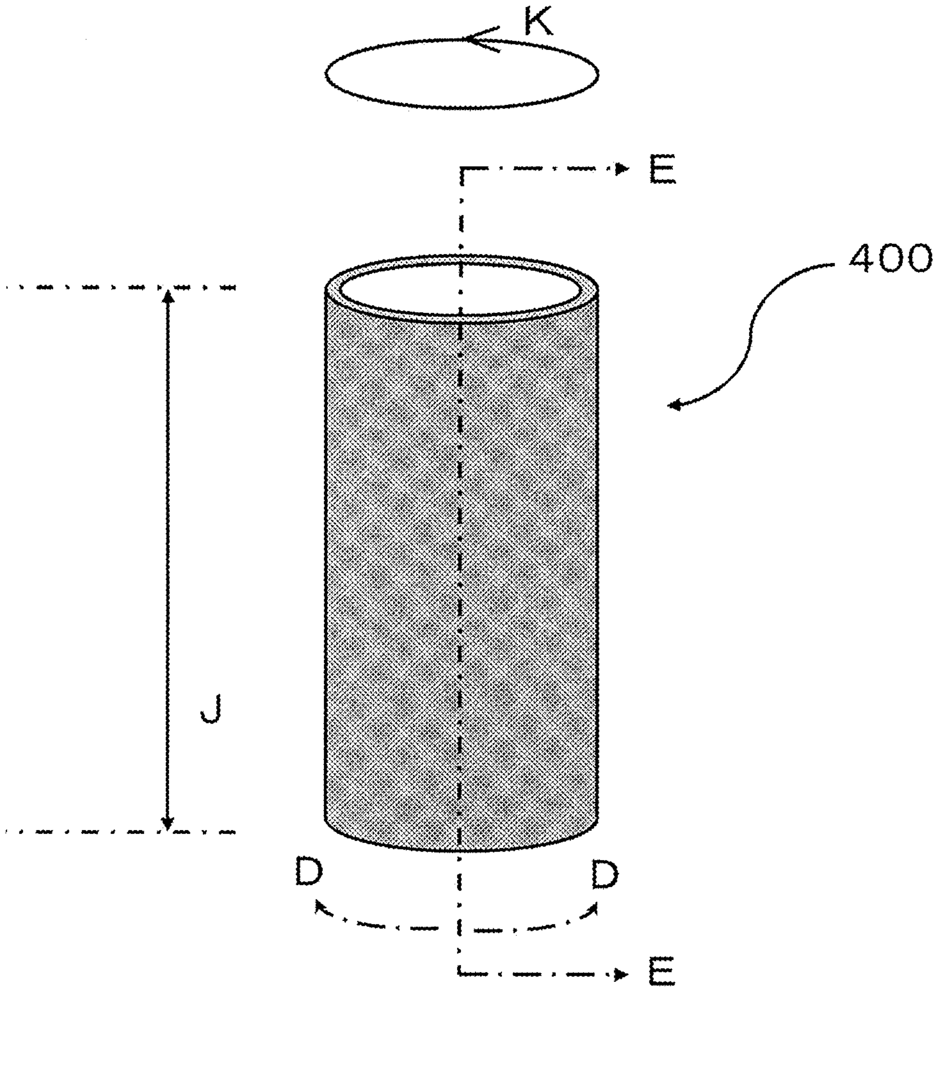
FIG. 5 is a conceptual view to explain measurement sites in composition analysis of a cylindrical target.

FIG. 5 is a conceptual view to explain measurement sites in a cylindrical target. In the case of the sputtering target having a cylindrical shape, the side surface of the cylinder is a sputter surface, and the development view is a rectangle or a square, and therefore (Condition 2) can be considered in the same manner as in the case of FIGS. 3 and 4. In FIG. 5, in the case of a sputtering target 400 having a cylindrical shape having a height (length) of J and a body circumference length of K, an E-E cross section and a D-D development surface are considered so that the E-E cross section is one of ends of the D-D development surface. First, the measurement sites in the composition analysis in the target thickness direction are considered in the same manner as in FIG. 4 in the E-E cross section. That is, it is considered that the height J of the cylindrical material corresponds to L2 in FIG. 4 and the thickness of the cylindrical material corresponds to the thickness tin FIG. 4, and the measurement point is set. In addition, the measurement sites in the in-plane direction of the sputter surface are considered in the same manner as in FIG. 3 in the D-D development surface. That is, it is considered that the height J of the cylindrical material corresponds to L2 in FIG. 3 and the peripheral length K of the body of the cylindrical material corresponds to L1 in FIG. 3. The length of J and the circumferential length of K have a relationship of J>K, J=K, or J<K. In the case of a cylindrical target, the body circumference length of the cylinder is preferably 100 to 350 mm, and more preferably 150 to 300 mm. The length of the cylinder is preferably 300 to 3,000 mm, and more preferably 500 to 2,000 mm. The thickness of the target is preferably 1 to 30 mm, and more preferably 3 to 26 mm. In the present embodiment, a larger target is expected to be more effective.

The sputtering target according to the present embodiment preferably has a structure in which at least one of a material containing aluminum and a rare earth element, a material containing aluminum and a titanium group element, or a material containing aluminum, a rare earth element, and a titanium group element is present in the aluminum matrix, or a structure including at least a composite phase including any one of a phase consisting of a rare earth element and an inevitable impurity as metal species, a phase consisting of a titanium group element and an inevitable impurity as metal species, and a phase consisting of a rare earth element, a titanium group element, and an inevitable impurity as metal species in the aluminum matrix. A sputtering target is provided that has improved conductivity and, for example, improves productivity when a film is formed using a DC sputtering device.

Next, specific microstructures of the sputtering target according to the present embodiment will be described. The specific microstructures of the sputtering target are classified into, for example, a first structure to a fifth structure and modified examples thereof. Here, forms having an aluminum matrix are the second structure, the fifth structure, and modified examples thereof, and particularly, the second structure and the second structure-2 as a modified example of the second structure, and the fifth structure and the fifth structure-2 as a modified example of the fifth structure.

[First Structure]

The sputtering target according to the present embodiment has the first structure including at least one of a material containing aluminum and a rare earth element (hereinafter, also referred to as RE), a material containing aluminum and a titanium group element (hereinafter, also referred to as TI), or a material containing aluminum, a rare earth element, and a titanium group element. That is, the first structure has a form including any one of the seven combinations of materials, that is, a form in which a material A containing Al and an RE, a material B containing Al and a TI, or a material C containing Al, an RE, and a TI is present, or a form in which both the material A and the material B, both the material A and the material C, both the material B and the material C, or all of the material A, the material B, and the material C are present.

In the present embodiment, the term "material" means a material included in the sputtering target, and an example of the material is an alloy or a nitride. Furthermore, examples of the alloy include solid solutions, eutectics, and intermetallic compounds. Note that a nitride that is metal-like may be contained in the alloy.

[Second Structure]

The sputtering target according to the present embodiment has the second structure in which at least one of a material containing aluminum and a rare earth element, a material containing aluminum and a titanium group element, or a material containing aluminum, a rare earth element, and a titanium group element is present in an aluminum matrix. That is, in the second structure, any one of the seven combinations of materials, listed for the first structure, is present in the aluminum matrix. That is, the second structure has a form including a combination, that is, a form in which the material A, the material B, or the material C is present in the aluminum matrix, or a form in which both the material A and the material B, both the material A and the material C, both the material B and the material C, or all of the material A, the material B, and the material C are present in the aluminum matrix.

Figure 6:
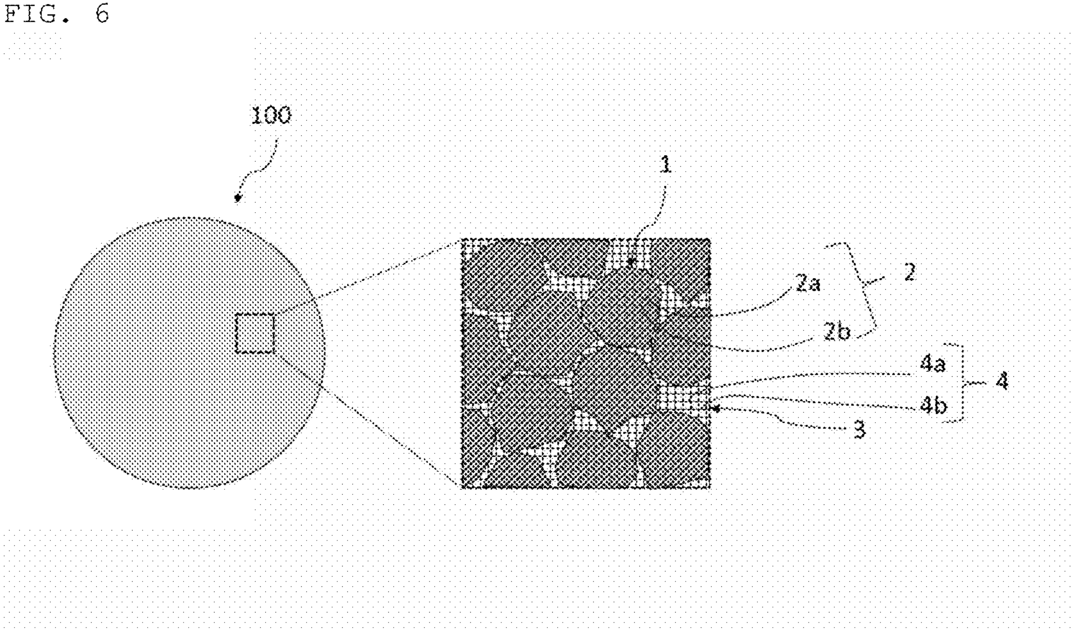
FIG. 6 is an explanatory view to explain a concept of an aluminum matrix.

In the present embodiment, the term "aluminum matrix" can be also referred to as aluminum matrix phase. FIG. 6 explains a concept of an aluminum matrix using the second structure as an example. A sputtering target 100 has a microstructure in which a material containing aluminum and a rare earth element, specifically, an Al-RE alloy is present in an aluminum matrix. That is, a plurality of Al-RE alloy particles 1 are attached to each other via an Al matrix 3. Each of the Al-RE alloy particles 1 is an aggregate of Al-RE alloy crystal grains 2. A boundary between an Al-RE alloy crystal grain 2*a* and an adjacent Al-RE alloy crystal grain 2*b* is a grain boundary. The Al matrix 3 is an aggregate of aluminum crystal grains 4. A boundary between an aluminum crystal grain 4*a* and an adjacent aluminum crystal grain 4*b* is a grain boundary. As described above, in the present embodiment, the term "matrix" means a phase attaching a plurality of metal particles, alloy particles, or nitride particles to each other, and in the concept of the matrix, the phase, attaching particles, itself is an aggregate of crystal grains. In general, an intermetallic compound or a nitride is characterized in that an electrical conductivity and a plastic workability (ductility) thereof, which are characteristics of a metal, are poor. In a case where the Al-RE alloy of the sputtering target consists of only an intermetallic compound, only a nitride, or an intermetallic compound and a nitride, the electrical conductivity of the sputtering target tends to deteriorate. However, if an aluminum (matrix) phase is present, deterioration of the electrical conductivity of the entire sputtering target can be prevented. Furthermore, in a case where the Al-RE alloy of the sputtering target consists of only an intermetallic compound, only a nitride, or an intermetallic compound and a nitride, the sputtering target tends to be very brittle. However, if an aluminum (matrix) phase is present, the brittleness of the target can be lessened.

[Third Structure]

The sputtering target according to the present embodiment has a third structure including a composite phase including a phase consisting of aluminum and an inevitable impurity as metal species, and including either a phase consisting of a rare earth element and an inevitable impurity as metal species or a phase consisting of a titanium group element and an inevitable impurity as metal species or both a phase consisting of a rare earth element and an inevitable impurity as metal species and a phase consisting of a titanium group element and an inevitable impurity as metal species. That is, the third structure has a form including any one of the three combinations, that is, a form including a composite phase including a phase containing aluminum as a metal species and a phase containing a rare earth element as a metal species, a form including a composite phase including a phase containing aluminum as a metal species and a phase containing a titanium group element as a metal species, or a form including a composite phase including a phase containing aluminum as a metal species, a phase containing a rare earth element as a metal species, and a phase containing a titanium group element as a metal species.

Examples of the inevitable impurity include Fe and Ni, and the concentration by atomic percentage of the inevitable impurity is, for example, preferably 200 ppm or less, and more preferably 100 ppm or less.

In the present embodiment, the term "phase" expresses a concept of an aggregate that is a solid phase and is grouped according to the composition, for example, an aggregate of particles having the same composition.

In the present embodiment, the term "composite phase" expresses a concept of a state in which two or more kinds of "phases" are present. Each kind of phase of these phases has a different composition.

[Fourth Structure]

The sputtering target according to the present embodiment has a fourth structure including a composite phase including a phase containing aluminum and either a rare earth element or a titanium group element or both a rare earth element and a titanium group element, and including at least one of a phase consisting of aluminum and an inevitable impurity as metal species, a phase consisting of a rare earth element and an inevitable impurity as metal species, or a phase consisting of a titanium group element and an inevitable impurity as metal species. That is, the fourth structure includes any one of the following 21 combinations of phases. Here, a phase containing aluminum and a rare earth element is referred to as a phase D, a phase containing aluminum and a titanium group element is referred to as a phase E, and a phase containing aluminum, a rare earth element, and a titanium group element is referred to as a phase F. Furthermore, a phase consisting of aluminum and an inevitable impurity as metal species is referred to as a phase G, a phase consisting of a rare earth element and an inevitable impurity as metal species is referred to as a phase H, and a phase consisting of a titanium group element and an inevitable impurity as metal species is referred to as a phase I. The fourth structure includes a composite phase including the following phases, that is, phase D and phase G, phase D and phase H, phase D and phase I, phase D, phase G, and phase H, phase D, phase G, and phase I, phase D, phase H, and phase I, phase D, phase G, phase H, and phase I, phase E and phase G, phase E and phase H, phase E and phase I, phase E, phase G, and phase H, phase E, phase G, and phase I, phase E, phase H, and phase I, phase E, phase G, phase H, and phase I, phase F and phase G, phase F and phase H, phase F and phase I, phase F, phase G, and phase H, phase F, phase G, and phase I, phase F, phase H, and phase I, or phase F, phase G, phase H, and phase I.

[Fifth Structure]

The sputtering target according to the present embodiment has a fifth structure including, in an aluminum matrix, at least a composite phase including either a phase consisting of a rare earth element and an inevitable impurity as metal species or a phase consisting of a titanium group element and an inevitable impurity as metal species or both a phase consisting of a rare earth element and an inevitable impurity as metal species and a phase consisting of a titanium group element and an inevitable impurity as metal species. The fifth structure includes any one of the following three composite phases in an aluminum matrix. That is, the fifth structure includes a composite phase in which a phase H is present in an aluminum matrix, a composite phase in which a phase I is present in an aluminum matrix, or a composite phase in which a phase H and a phase I are present in an aluminum matrix.

Also in the present embodiment, the term "aluminum matrix" can be also referred to as aluminum matrix phase. In the sputtering target, the fifth structure has a microstructure, in which a phase H, a phase I, or both a phase H and a phase I are present in an aluminum matrix, forming a composite phase. The aluminum matrix is an aggregate of aluminum crystal grains, and a boundary between an aluminum crystal grain and an adjacent aluminum crystal grain is a grain boundary. The phase H is, for example, a concept of an aggregate of particles having the same composition. The phase I is the same as the above. In a case where both the phase H and the phase I are present, two phases having different compositions are present in the aluminum matrix.

[Modified Example of Fifth Structure]

In the sputtering target according to the present embodiment, forms of the fifth structure include a form in which the composite phase further includes a phase consisting of aluminum and an inevitable impurity as metal species.

The fifth structure includes any one of the following three composite phases in an aluminum matrix. That is, the composite phases are a composite phase in which a phase H and a phase G are present in an aluminum matrix, a composite phase in which a phase I and a phase G are present in an aluminum matrix, and a composite phase in which a phase H, a phase I, and a phase G are present in an aluminum matrix.

Forms of the first structure to the fifth structure and the modified example of the fifth structure further include the following forms.

[First Structure-2]

An example of the form is a form in which the sputtering target according to the present embodiment has the first structure and the material is an alloy, a form in which the sputtering target has the first structure and the material is a nitride, or a form in which the sputtering target has the first structure and the material is a combination of an alloy and a nitride. Here, the materials are combined into any one of the seven forms, that is, a form in which a material A containing Al and an RE, a material B containing Al and a TI, or a material C containing Al, an RE, and a TI is present, or a form in which both the material A and the material B, both the material A and the material C, both the material B and the material C, or all of the material A, the material B, and the material C are present.

[Second Structure-2]

An example of the form is a form in which the sputtering target according to the present embodiment has the second structure and the material is an alloy, a form in which the sputtering target has the second structure and the material is a nitride, or a form in which the sputtering target has the second structure and the material is a combination of an alloy and a nitride. Here, the material is any one of the seven combinations of materials listed in [First Structure].

[Third Structure-2]

An example of the form is a form in which the sputtering target according to the present embodiment has the third structure and the composite phase is a composite of metal phases, a form in which the sputtering target has the third structure and the composite phase is a composite of nitride phases, or a form in which the sputtering target has the third structure and the composite phase is a composite of a metal phase and a nitride phase. Here, the phrase "the composite phase is a composite of metal phases" means that the composite phase is a composite phase including an Al phase and an RE phase, a composite phase including an Al phase and a TI phase, or a composite phase including an Al phase, an RE phase, and a TI phase. The phrase "the composite phase is a composite of nitride phases" means that the composite phase is a composite phase including an MN phase and an REN phase, a composite phase including an AlN phase and a TIN phase, or a composite phase including an AlN phase, an REN phase, and a TIN phase. Furthermore, the phrase "the composite phase is a composite of a metal phase and a nitride phase" means, for example, the composite phase is a composite phase including an Al phase and an REN phase, a composite phase including an AlN phase and an RE phase, a composite phase including an Al phase, an AlN phase, and an RE phase, a composite phase including an Al phase, an AlN phase, and an REN phase, a composite phase including an Al phase, an RE phase, and an REN phase, a composite phase including an AlN phase, an RE phase, and an REN phase, a composite phase including an Al phase, an AlN phase, an RE phase, and an REN phase, a composite phase including an Al phase and a TIN phase, a composite phase including an AlN phase and a TI phase, a composite phase including an Al phase, an AlN phase, and a TI phase, a composite phase including an Al phase, an AlN phase, and a TIN phase, a composite phase including an Al phase, a TI phase, and a TIN phase, a composite phase including an AlN phase, a TI phase, and a TIN phase, a composite phase including an Al phase, an AlN phase, a TI phase, and a TIN phase, a composite phase including an Al phase, an AlN phase, an RE phase, and a TI phase, a composite phase including an Al phase, an AlN phase, an REN phase, and a TI phase, a composite phase including an Al phase, an AlN phase, an RE phase, and a TIN phase, a composite phase including an Al phase, an AlN phase, an REN phase, and a TIN phase, a composite phase including an Al phase, an RE phase, an REN phase, and a TI phase, a composite phase including an AlN phase, an RE phase, an REN phase, and a TI phase, a composite phase including an Al phase, an RE phase, an REN phase, and a TIN phase, a composite phase including an AlN phase, an RE phase, an REN phase, and a TIN phase, a composite phase including an Al phase, an RE phase, a TI phase, and a TIN phase, a composite phase including an AlN phase, an RE phase, a TI phase, and a TIN phase, a composite phase including an Al phase, an REN phase, a TI phase, and a TIN phase, a composite phase including an AlN phase, an REN phase, a TI phase, and a TIN phase, a composite phase including an Al phase, an AlN phase, an RE phase, an REN phase, and a TI phase, a composite phase including an Al phase, an AlN phase, an RE phase, an REN phase, and a TIN phase, a composite phase including an Al phase, an AlN phase, an RE phase, a TI phase, and a TIN phase, a composite phase including an Al phase, an AlN phase, an REN phase, a TI phase, and a TIN phase, a composite phase including an Al phase, an RE phase, an REN phase, a TI phase, and a TIN phase, a composite phase including an AlN phase, an RE phase, an REN phase, a TI phase, and a TIN phase, or a composite phase including an Al phase, an AlN phase, an RE phase, an REN phase, a TI phase, and a TIN phase. Note that the valence is omitted from the notation.

In the present embodiment, the term "metal phase" expresses a concept of a phase consisting of a single metal element.

In the present embodiment, the term "nitride phase" expresses a concept of a phase consisting of a nitride.

[Fourth Structure-2]

An example of the form is a form in which the sputtering target according to the present embodiment has the fourth structure and the composite phase is a composite of an alloy phase and a metal phase, a form in which the sputtering target has the fourth structure and the composite phase is a composite of an alloy phase and a nitride phase, a form in which the sputtering target has the fourth structure and the composite phase is a composite of a nitride phase and a metal phase, a form in which the sputtering target has the fourth structure and the composite phase is a composite of a nitride phase and another nitride phase, or a form in which the sputtering target has the fourth structure and the composite phase is a composite of an alloy phase, a metal phase, and a nitride phase. Here, the term "metal phase" refers to a phase G, a phase H, or a phase I in a metal state without being nitrided or oxidized, the term "alloy phase" refers to a phase D, a phase E, or a phase F in an alloy state without being nitrided or oxidized, and the term "nitride phase" refers to a phase G, a phase H, a phase I, a phase D, a phase E, or a phase F that is nitrided. In some cases, one metal phase, one alloy phase, and one nitride phase are each present in the target, in some cases, two or more metal phases, two or more alloy phases, and two or more nitride phases are each present in the target, and in some cases, a combination of a plurality phases selected out of metal phases, alloy phases, and nitride phases is present in the target. An example of these forms is a form in which at least one of an alloy phase of a phase D or a nitride phase of a phase D incorporates at least one of a metal phase of a phase G, a nitride phase of a phase G, a metal phase of a phase H, a nitride phase of a phase H, a metal phase of a phase I, or a nitride phase of a phase I, a form in which at least one of an alloy phase of a phase E or a nitride phase of a phase E incorporates at least one of a metal phase of a phase G, a nitride phase of a phase G, a metal phase of a phase H, a nitride phase of a phase H, a metal phase of a phase I, or a nitride phase of a phase I, or a form in which at least one of an alloy phase of a phase F or a nitride phase of a phase F incorporates at least one of a metal phase of a phase G, a nitride phase of a phase G, a metal phase of a phase H, a nitride phase of a phase H, a metal phase of a phase I, or a nitride phase of a phase I.

In the present embodiment, the term "alloy phase" expresses a concept of a phase consisting of an alloy.

[Fifth Structure-2]

An example of the form is a form in which the sputtering target according to the present embodiment has the fifth structure and the composite phase is a composite of an aluminum matrix and at least one metal phase, a form in which the sputtering target has the fifth structure and the composite phase is a composite of an aluminum matrix and at least one of an aluminum nitride phase, a nitride phase of a rare earth element, or a nitride phase of a titanium group element, or a form in which the sputtering target has the fifth structure and the composite phase is a composite of a metal phase and a nitride phase. Here, the phrase "at least one metal phase" means only a phase H, only a phase I, or both a phase H and a phase I. The phrase "the composite phase is a composite of an aluminum matrix and at least one of an aluminum nitride phase, a nitride phase of a rare earth element, or a nitride phase of a titanium group element" means that the composite phase is, for example, a composite phase including an Al matrix and an REN phase, a composite phase including an Al matrix and a TIN phase, a composite phase including an Al matrix, an AlN phase, and an REN phase, a composite phase including an Al matrix, an AlN phase, and a TIN phase, a composite phase including an Al matrix, an REN phase, and a TIN phase, or a composite phase including an Al matrix, an AlN phase, an REN phase, and a TIN phase. The phrase "the composite phase is a composite of a metal phase and a nitride phase" means that the composite phase is, for example, a composite phase including an Al matrix, an RE phase, and a TIN phase, a composite phase including an Al matrix, an REN phase, and a TI phase, a composite phase including an Al matrix, an AlN phase, an RE phase, and a TI phase, a composite phase including an Al matrix, an AlN phase, an REN phase, and a TI phase, a composite phase including an Al matrix, an AlN phase, an RE phase, and a TIN phase, a composite phase including an Al matrix, an RE phase, an REN phase, and a TI phase, a composite phase including an Al matrix, an RE phase, an REN phase, and a TIN phase, a composite phase including an Al matrix, an RE phase, a TI phase, and a TIN phase, a composite phase including an Al matrix, an REN phase, a TI phase, and a TIN phase, a composite phase including an Al matrix, an AlN phase, an RE phase, an REN phase, and a TI phase, a composite phase including an Al matrix, an AlN phase, an RE phase, an REN phase, and a TIN phase, a composite phase including an Al matrix, an AlN phase, an RE phase, a TI phase, and a TIN phase, a composite phase including an Al matrix, an AlN phase, an REN phase, a TI phase, and a TIN phase, a composite phase including an Al matrix, an RE phase, an REN phase, a TI phase, and a TIN phase, or a composite phase including an Al matrix, an AlN phase, an RE phase, an REN phase, a TI phase, and a TIN phase. Note that N means a nitrogen element, and for example, the term "AlN phase" means an aluminum nitride phase. The valence of a nitride is omitted from the notation.

Forms of the fifth structure-2 include a form in which the composite phase is a composite of nitride phases further including an aluminum nitride phase. That is, the composite phase in the fifth structure-2 is a composite phase obtained by adding an AlN phase to each form example listed for the fifth structure. Specifically, the present embodiment includes a fifth structure-2 particularly in a case (1) in which the phrase "the composite phase is a composite of an aluminum matrix and at least one of an aluminum nitride phase, a nitride phase of a rare earth element, or a nitride phase of a titanium group element" means that the composite phase is a composite phase including an Al matrix, an AlN phase, and an REN phase, a composite phase including an Al matrix, an AlN phase, and a TIN phase, or a composite phase including an Al matrix, an AlN phase, an REN phase, and a TIN phase and in a case (2) in which the phrase "the composite phase is a composite of a metal phase and a nitride phase" means that the composite phase is a composite phase including an Al matrix, an AlN phase, an RE phase, and a TI phase, a composite phase including an Al matrix, an AlN phase, an REN phase, and a TI phase, a composite phase including an Al matrix, an AlN phase, an RE phase, and a TIN phase, a composite phase including an Al matrix, an AlN phase, an RE phase, an REN phase, and a TI phase, a composite phase including an Al matrix, an AlN phase, an RE phase, an REN phase, and a TIN phase, a composite phase including an Al matrix, an AlN phase, an RE phase, a TI phase, and a TIN phase, a composite phase including an Al matrix, an AlN phase, an REN phase, a TI phase, and a TIN phase, or a composite phase including an Al matrix, an AlN phase, an RE phase, an REN phase, a TI phase, and a TIN phase.

In the sputtering target according to the present embodiment, an intermetallic compound including at least two elements selected from aluminum, a rare earth element, or a titanium group element is preferably present in the sputtering target. For example, in the first structure or the second structure, such an intermetallic compound is present in the sputtering target. In a case where an alloy phase is present in the fourth structure, an intermetallic compound is present in the alloy phase. The variation in composition can be suppressed by reducing the number of sites of single aluminum, a single rare earth element, and a single titanium group element. In a case where the target includes a combination of single metals, a homogeneous film is difficult to obtain because the sputtering rates of the single metals are each applied to the sputtering to cause a remarkable variation, but by the intermetallic compound present in the target, the difference in sputtering rate between the metal elements is lessened, and thus the composition unevenness in the obtained film is reduced.

In the sputtering target according to the present embodiment, the intermetallic compound may include one, two, three, or four kinds of intermetallic compounds being present in the sputtering target. For example, in a case where an alloy phase is present in the first structure, the second structure, or the fourth structure, one, two, three, or four kinds of the intermetallic compounds are present in the sputtering target according to the number of kinds of metal species. In a case where the target includes a combination of single metals, a homogeneous film is difficult to obtain because the sputtering rates of the single metals are each applied to the sputtering to cause a remarkable variation, but by the presence of one or more intermetallic compounds, the difference in sputtering rate between the metal elements is further lessened, and thus the composition unevenness in the obtained film is further reduced.

In the sputtering target according to the present embodiment, at least one nitride of at least one element selected from aluminum, a rare earth element, or a titanium group element may be present in the sputtering target. When a nitride film of a piezoelectric element is formed, the piezoelectric element can withstand a high temperature and can have a high Q factor. For example, in all of the first structure to fifth structure, a nitrogen element is introduced, and thus a nitride is present. The number of kinds of present nitrides is one, two, three, four, or more according to the number of kinds of metal species.

In the sputtering target according to the present embodiment, the rare earth element is preferably at least one of scandium or yttrium. When a nitride film of a piezoelectric element is formed, the piezoelectric element can withstand a high temperature and can have a high Q factor. The rare earth element is single scandium, single yttrium, or a combination of scandium and yttrium. In a case where both scandium and yttrium are contained as a rare earth element, an example of the form is a form in which an Al—Sc—Y material or an Al—Sc—Y phase is present, a form in which at least two of an Al—Sc material, an Al—Y material, or an Al—Sc—Y material are simultaneously present, or a form in which at least two of an Al—Sc phase, an Al—Y phase, or an Al—Sc—Y phase are simultaneously present.

In the sputtering target according to the present embodiment, the titanium group element is preferably at least one of titanium, zirconium, or hafnium. When a nitride film of a piezoelectric element is formed, the piezoelectric element can withstand a high temperature and can have a high Q factor. Examples of the titanium group element include single titanium, single zirconium, single hafnium, a combination of titanium and zirconium, a combination of titanium and hafnium, a combination of zirconium and hafnium, and a combination of titanium, zirconium, and hafnium. In a case where, for example, both titanium and zirconium are contained as a titanium group element, an example of the form is a form in which an Al—Ti—Zr material or an Al—Ti—Zr phase is present, a form in which at least two of an Al—Ti material, an Al—Zr material, or an Al—Ti—Zr material are simultaneously present, or a form in which at least two of an Al—Ti phase, an Al—Zr phase, or an Al—Ti—Zr phase are simultaneously present. In a case where both titanium and hafnium are contained, an example of the form is a form in which an Al—Ti—Hf material or an Al—Ti—Hf phase is present, a form in which at least two of an Al—Ti material, an Al—Hf material, or an Al—Ti—Hf material are simultaneously present, or a form in which at least two of an Al—Ti phase, an Al—Hf phase, or an Al—Ti—Hf phase are simultaneously present. In a case where both zirconium and hafnium are contained, an example of the form is a form in which an Al—Zr—Hf material or an Al—Zr—Hf phase is present, a form in which at least two of an Al—Zr material, an Al—Hf material, or an Al—Zr—Hf material are simultaneously present, or a form in which at least two of an Al—Zr phase, an Al—Hf phase, or an Al—Zr—Hf phase are simultaneously present. In a case where titanium, zirconium, and hafnium are contained, an example of the form is a form in which an Al—Ti—Zr—Hf material or an Al—Ti—Zr—Hf phase is present, a form in which at least two of an Al—Ti material, an Al—Zr material, an Al—Hf material, an Al—Ti—Zr material, an Al—Ti—Hf material, an Al—Zr—Hf material, or an Al—Ti—Zr—Hf material are simultaneously present, a form in which at least two of an Al—Ti phase, an Al—Zr phase, an Al—Hf phase, an Al—Ti—Zr phase, an Al—Ti—Hf phase, an Al—Zr—Hf phase, or an Al—Ti—Zr—Hf phase are simultaneously present, a form in which a material or a phase containing Al and any two of Ti, Zr, and Hf is further added to a form described above, or a form in which a material or a phase containing Al and any one of Ti, Zr, and Hf is further added to a form described above.

In the sputtering target according to the present embodiment, examples of the rare earth element contained in addition to aluminum include scandium and yttrium, and examples of the titanium group element contained in addition to aluminum include titanium, zirconium, and hafnium. The scandium content in the target is preferably 5 to 75 atom %. The scandium content is more preferably 10 to 50 atom %. The yttrium content in the target is preferably 5 to 75 atom %. The yttrium content is more preferably 10 to 50 atom %. The titanium content in the target is preferably 5 to 75 atom %. The titanium content is more preferably 10 to 50 atom %. The zirconium content in the target is preferably 5 to 75 atom %. The zirconium content is more preferably 10 to 50 atom %. The hafnium content in the target is preferably 5 to 75 atom %. The hafnium content is more preferably 10 to 50 atom %. The sputtering target according to the present embodiment includes aluminum and at least one of the above-described elements at a content satisfying the above-described range.

In the case of forming an alloy containing a rare earth element and a titanium group element in addition to aluminum, first, an aluminum-rare earth element alloy such as an aluminum-scandium alloy or an aluminum-yttrium alloy is formed in the above-described composition range. Next, an aluminum-titanium group element alloy such as an aluminum-titanium alloy, an aluminum-zirconium alloy, or an aluminum-hafnium alloy is formed in the above-described composition range. Then, the aluminum-rare earth element alloy and the aluminum-titanium group element alloy are mixed while the content of each alloy is adjusted to form an aluminum-rare earth element-titanium group element alloy. An aluminum-rare earth element-titanium group element alloy may be directly formed without forming a ternary alloy by mixing binary alloys as described above. By forming an intermetallic compound in the sputtering target and forming a nitride film during sputtering, it is possible to form a piezoelectric film capable of having a high Q factor even at a high temperature.

A method for manufacturing a sputtering target according to the present embodiment will be described. A method for manufacturing the sputtering target according to the present embodiment includes: a first step of manufacturing (1) a raw material including aluminum and a rare earth element, (2) a raw material including aluminum and a titanium group element, or (3) a raw material including aluminum, a rare earth element, and a titanium group element; a second step of manufacturing (1) an alloy powder of aluminum and the rare earth element (aluminum-rare earth element), (2) an alloy powder of aluminum and the titanium group element (aluminum-titanium group element), or (3) an alloy powder of aluminum, the rare earth element, and the titanium group element (aluminum-rare earth element-titanium group element) from the raw material manufactured in the first step; and a third step of obtaining (1) a sintered body of aluminum-rare earth element, (2) a sintered body of aluminum-titanium group element, or (3) a sintered body of aluminum-rare earth element-titanium group element from the powder obtained in the second step. In the case of manufacturing a sputtering target including an aluminum matrix, a method for manufacturing the sputtering target includes: a first step of manufacturing an aluminum raw material to be mainly a matrix and, as a raw material to be mainly a material or phase present in the matrix, (1) a raw material including aluminum and a rare earth element, (2) a raw material including aluminum and a titanium group element, or (3) a raw material including aluminum, a rare earth element, and a titanium group element; a second step of manufacturing an aluminum powder to be mainly the matrix and, as an alloy powder to be mainly the material or phase present in the matrix, (1) an alloy powder of aluminum and the rare earth element (aluminum-rare earth element), (2) an alloy powder of aluminum and the titanium group element (aluminum-titanium group element), or (3) an alloy powder of aluminum, the rare earth element, and the titanium group element (aluminum-rare earth element-titanium group element) from the raw materials manufactured in the first step; and a third step of obtaining (1) a sintered body of aluminum and aluminum-rare earth element, (2) a sintered body of aluminum and aluminum-titanium group element, or (3) a sintered body of aluminum and aluminum-rare earth element-titanium group element from the powders obtained in the second step.

[First Step]

This step is a step of producing a raw material to be used in manufacturing an aluminum-rare earth element alloy powder, an aluminum-titanium group element alloy powder, or an aluminum-rare earth element-titanium group element alloy powder in the second step. Examples of the form of the raw material produced in the first step to manufacture a powder (hereinafter, also simply referred to as a "raw material") include (1A) a form in which a single metal of each constituent element of an alloy target is prepared as a starting material, and the prepared single metals are mixed to obtain a raw material, (2A) a form in which an alloy having the same composition as an alloy target is prepared as a starting material and used as a raw material, and (3A) a form in which after preparing, as starting materials, alloy including the same constituent elements as an alloy target or including constituent elements lacking partially to have a composition ratio different from a desired composition ratio, and a single metal to be blended for adjustment to the desired composition, the alloy and the single metal are mixed to obtain a raw material. As a starting material, any one combination of aluminum and a rare earth element, aluminum and a titanium group element, or aluminum, a rare earth element, and a titanium group element is charged into a melting device and melted to produce a raw material including an aluminum-rare earth element alloy, a raw material including an aluminum-titanium group element alloy, or a raw material including an aluminum-rare earth element-titanium group element alloy. In regard to a material of a device or a container used in the melting device, the material preferably contains an impurity only in a small amount so that the raw material including an aluminum-rare earth element alloy, the raw material including an aluminum-titanium group element alloy, or the raw material including an aluminum-rare earth element-titanium group element alloy is not contaminated with a large amount of impurity after the melting. In regard to a melting method, a method is selected which is applicable to the following melting temperature. The melting temperature is a temperature of 1,300 to 1,800° C. at which an aluminum-rare earth element alloy is heated, a temperature of 1,300 to 1,800° C. at which an aluminum-titanium group element alloy is heated, or a temperature of 1,300 to 1,800° C. at which an aluminum-rare earth element-titanium group element alloy is heated. The atmosphere in the melting device is a vacuum atmosphere having a degree of vacuum of $1\times10^{-2}$ Pa or less, a nitrogen gas atmosphere containing a hydrogen gas at a content of 4 vol % or less, an inert gas atmosphere containing a hydrogen gas at a content of 4 vol % or less, or the like. When a raw material including aluminum is manufactured in a case where, for example, an aluminum matrix is included in a target, aluminum is heated at 700 to 900° C. and charged into a melting device to manufacture the raw material including aluminum in the same manner as other raw materials.

The raw material of an alloy powder has one of the three raw material forms described in (1A), (2A), and (3A) above, and in addition, may have a form of an alloy grain, an alloy lump, or a combination of a powder, a grain, and a lump. The terms "powder", "grain", and "lump" are used to express the difference in size between the raw materials, but the size of each raw material is not particularly limited as long as the raw material can be used in a powder manufacturing device in the second step. Specifically, the size of each raw material is not particularly limited as long as the raw material can be supplied to the powder manufacturing device because the raw material is melted in the powder manufacturing device in the second step.

[Second Step]

This step is a step of manufacturing an aluminum-rare earth element alloy powder, an aluminum-titanium group element alloy powder, or an aluminum-rare earth element-titanium group element alloy powder. At least one of the raw material including an aluminum-rare earth element alloy, the raw material including an aluminum-titanium group element alloy, or the raw material including an aluminum-rare earth element-titanium group element alloy manufactured in the first step is charged into a powder manufacturing device and melted to obtain a molten metal, and then the molten metal is sprayed with a gas, water, or the like and thus scattered and rapidly solidified to produce a powder. In regard to a material of a device or a container used in the powder manufacturing device, the material preferably contains an impurity only in a small amount so that the aluminum-rare earth element alloy powder, the aluminum-titanium group element alloy powder, or the aluminum-rare earth element-titanium group element alloy powder is not contaminated with a large amount of impurity after the melting. In regard to a melting method, a method is selected which is applicable to the following melting temperatures. The melting temperatures are a temperature of 1,300 to 1,800° C. at which the raw material including an aluminum-rare earth element alloy is heated, a temperature of 1,300 to 1,800° C. at which the raw material including an aluminum-titanium group element alloy is heated, and a temperature of 1,300 to 1,800° C. at which the raw material including an aluminum-rare earth element-titanium group element alloy is heated. The atmosphere in the powder manufacturing device is a vacuum atmosphere having a degree of vacuum of $1\times10^{-2}$ Pa or less, a nitrogen gas atmosphere containing a hydrogen gas at a content of 4 vol % or less, an inert gas atmosphere containing a hydrogen gas at a content of 4 vol % or less, or the like. The molten metal in spraying preferably has a temperature of "the melting point of the aluminum-rare earth element alloy, the aluminum-titanium group element alloy, or the aluminum-rare earth element-titanium group element alloy+100° C. or more", and more preferably a temperature of "the melting point of the aluminum-rare earth element alloy, the aluminum-titanium group element alloy, or the aluminum-rare earth element-titanium group element alloy+150 to 250° C.". This is because if the temperature is too high, the molten metal is not sufficiently cooled during granulation and is less likely to be formed into a powder, and the production efficiency is not good. If the temperature is too low, a problem is likely to occur that the nozzle is easily clogged during spraying. The gas used for spraying is nitrogen, argon, or the like, but is not limited to these gases. In the case of the alloy powder, deposition of the intermetallic compound of the alloy powder is more suppressed, than in the melting method, by rapid solidification to reduce the size of the deposited particle corresponding to an island in the sea-island structure in some cases, and this state is already obtained at the stage of the alloy powder and is maintained even after sintering or even at completion of forming a target. The element ratio in the rapidly cooled powder is the element ratio between aluminum and the rare earth element, aluminum and the titanium group element, or aluminum, the rare earth element, and the titanium group element prepared in the first step. When an aluminum powder is manufactured in a case where, for example, an aluminum matrix is included in a target, aluminum is heated at 700 to 900° C. and charged into a melting device to manufacture an aluminum powder in the same manner as other powders.

[Third Step]

This step is a step of obtaining a sintered body to be a target from the powder obtained in the second step. The sintering is performed with a hot press method (hereinafter, also referred to as HP), a spark plasma sintering method (hereinafter, also referred to as SPS), or a hot isostatic pressing method (hereinafter, also referred to as HIP). The aluminum-rare earth element alloy powder, the aluminum-titanium group element alloy powder, or the aluminum-rare earth element-titanium group element alloy powder obtained in the second step is used for sintering. The powders are used for sintering as in the following cases.

(1B) In the case of an aluminum-rare earth element alloy, an aluminum-rare earth element alloy powder is used.

(2B) In the case of an aluminum-titanium group element alloy, an aluminum-titanium group element alloy powder is used.

(3B) In the case of an aluminum-rare earth element-titanium group element alloy, for example, an aluminum-rare earth element-titanium group element alloy powder is used, or a mixed powder of two kinds of alloy powders obtained by mixing an aluminum-rare earth element alloy powder and an aluminum-titanium group element alloy powder is used.

It is preferable that any one of the powders shown in (1B) to (3B) above be filled into a mold, enclosed in the mold and a punch or the like under preliminary pressurization at 10 to 30 MPa, and then sintered. At this time, the sintering temperature is preferably 700 to 1,300° C., and the pressure is preferably 40 to 196 MPa. The atmosphere in the sintering device is a vacuum atmosphere having a degree of vacuum of $1\times10^{-2}$ Pa or less, a nitrogen gas atmosphere containing a hydrogen gas at a content of 4 vol % or less, an inert gas atmosphere containing a hydrogen gas at a content of 4 vol % or less, or the like. The hydrogen gas is preferably contained at a content of 0.1 vol % or more. The holding time (holding time at the maximum sintering temperature) is preferably 2 hours or less and more preferably 1 hour or less, and still more preferably, there is no holding time. When an aluminum powder is mixed with the alloy powder in (1B), (2B), or (3B) in a case where, for example, an aluminum matrix is included in a target, sintering is preferably performed under the same conditions as described above except that the sintering temperature is set to 500 to 600° C.

By performing at least the first step to the third step, composition deviation can be suppressed in the in-plane direction and the thickness direction of the sputtering target, and the produced sputtering target can contain an impurity, only in a small amount, that affects thin film formation. Furthermore, the produced sputtering target can contain chlorine only in a small amount.

Methods for manufacturing the sputtering target according to the present embodiment also includes a modified example as described below. That is, in the first step, as an aluminum raw material to be mainly a matrix and a raw material to be mainly a material or phase present in the matrix, (1) a rare earth element raw material, (2) a titanium group element raw material, or (3) a raw material including a rare earth element and a titanium group element may be manufactured. In the second step, the raw materials manufactured in the first step may be each formed into an atomized powder. In the third step, (1) a sintered body of aluminum and a rare earth element, (2) a sintered body of aluminum and a titanium group element, or (3) a sintered body of aluminum and rare earth element-titanium group element is obtained from the raw material obtained in the first step or the powder obtained in the second step.

In the present embodiment, examples of the method of composition analysis under (Condition 1) and (Condition 2) include energy dispersive X-ray spectroscopy (EDS), high frequency inductively coupled plasma atomic emission spectroscopy (ICP), and X-ray fluorescence analysis (XRF), and composition analysis by EDS is preferable.

EXAMPLES

Hereinafter, the present invention will be described in more detail with reference to Examples, but the present invention is not construed as being limited to Examples.

Example 1

Figure 7:
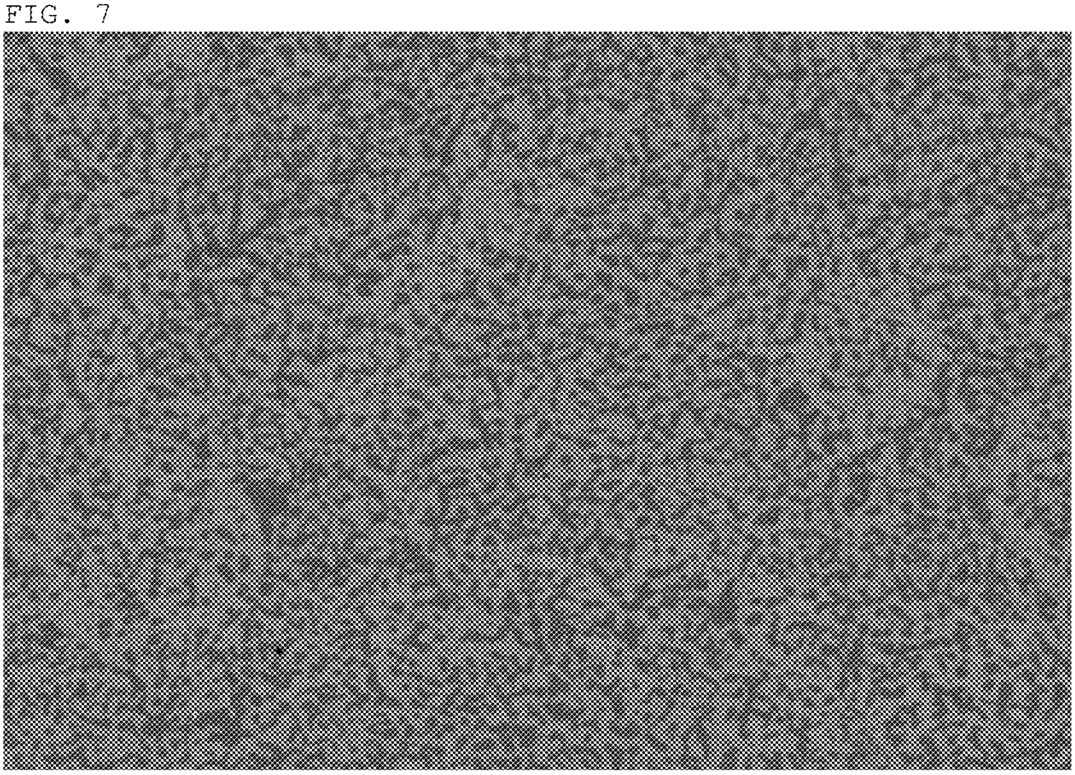
FIG. 7 is an image obtained by observing a surface of an Al—Sc target in Example 1 with an electron microscope.

An Al raw material having a purity of 4N and a Sc raw material having a purity of 3N were charged into a powder manufacturing device, and next, the inside of the powder manufacturing device was adjusted to a vacuum atmosphere at $5\times10^{-3}$ Pa or less, the Al raw material and the Sc raw material were melted at a melting temperature of 1,700° C. to obtain a molten metal, and next, the molten metal was sprayed with an argon gas and thus scattered and rapidly solidified to produce an Al-40 atom % Sc powder having a particle size of 150 μm or less (in this case, Al is 60 atom % Al, but the atomic percentage of Al is omitted from the description, and the same applies hereinafter). Then, the Al-40 atom % Sc powder was filled into a carbon mold for spark plasma sintering (hereinafter, also referred to as SPS sintering). Next, the alloy powder was enclosed in the mold and a punch or the like under preliminary pressurization at 10 MPa, and the mold filled with the alloy powder was set in an SPS device (model number: SPS-825, manufactured by SPS SYNTEX INC.). Then, sintering was performed under the sintering conditions of a sintering temperature of 550° C., a pressure of 30 MPa, a vacuum atmosphere at $8\times10^{-3}$ Pa or less as the atmosphere in a sintering device, and a holding time of a maximum sintering temperature of 0 hour. The Al-40 atom % Sc sintered body was processed using a grinding machine, a lathe, or the like to produce an Al-40 atom % Sc target having a size of Φ50.8 mm×5 mmt in Example 1. Next, the cross section of the Al-40 atom % Sc target was observed using an electron microscope at a magnification of 500 times. FIG. 7 shows an image obtained by observation with the electron microscope. The image in FIG. 7 has a lateral side length of 250 μm. From FIG. 7, it has been confirmed that the contrast is small, and the intermetallic compound is fine and uniformly dispersed. Furthermore, the image obtained with the electron microscope in FIG. 7 shows a result that the target includes two kinds of intermetallic compounds of $Al_2Sc$ and AlSc, and has the first structure. Next, the chlorine content in the Al-40 atom % Sc target in Example 1 was measured using a mass spectrometer (model number: Element GD, manufactured by Thermo Fisher Scientific K. K.). The chlorine content was 5.6 ppm. Next, using the Al-40 atom % Sc target in Example 1, a film was formed on a Φ76.2 mm×5 mmt single-crystal Si substrate with a sputtering device (model number: MPS-6000-C4, manufactured by ULVAC, Inc.). The film formation condition was such that the sputtering device was evacuated until the degree of vacuum before film formation reached $5\times10^{-5}$ Pa or less, and then the pressure in the sputtering device was adjusted to 0.13 Pa using an Ar gas. Then, the sputtering power of the Al-40 atom % Sc target was adjusted to 150 W while the single-crystal Si substrate was heated to 300° C., and an Al-40 atom % Sc film having a thickness of 1 μm was formed on the single-crystal Si substrate. At this time, the circumstance of sputtering of the Al-40 atom % Sc target was observed, under which the voltage was stable and the film was formed without confirming abnormal discharge or the like.

Example 2

An Al-30 atom % Sc target in Example 2 was obtained in the same manner as in Example 1 except that an Al-30 atom % Sc powder having a particle size of 150 μm or less was manufactured instead of the Al-40 atom % Sc powder in Example 1, and an Al-30 atom % Sc target having a size of Φ50.8 mm×5 mmt was manufactured instead of the Al-40 atom % Sc target in Example 1. Next, the chlorine content in the Al-30 atom % Sc target in Example 2 was measured in the same manner as in Example 1. The chlorine content was 3.7 ppm. The target included two kinds of intermetallic compounds of $Al_2Sc$ and AlSc, and had the first structure. Next, an Al-30 atom % Sc film having a thickness of 1 μm was formed on a single-crystal Si substrate in the same manner as in Example 1 except that the Al-30 atom % Sc target in Example 2 was used instead of the Al-40 atom % Sc target in Example 1. At this time, the circumstance of sputtering of the Al-30 atom % Sc target was observed, under which the voltage was stable and the film was formed without confirming abnormal discharge or the like.

Example 3

An Al-40 atom % Ti powder having a particle size of 150 μm or less was produced in the same manner as in Example 1 except that an Al raw material having a purity of 4N and a Ti raw material having a purity of 3N were used instead of the Al raw material having a purity of 4N and the Sc raw material having a purity of 3N. Next, an Al-40 atom % Ti target in Example 3 was obtained in the same manner as in Example 1 except that an Al-40 atom % Ti target having a size of Φ50.8 mm×5 mmt was manufactured instead of the Al-40 atom % Sc target in Example 1. Next, the chlorine content in the Al-40 atom % Ti target in Example 3 was measured in the same manner as in Example 1. The chlorine content was 4.0 ppm. The target included two kinds of intermetallic compounds of $Al_2Ti$ and AlTi, and had the first structure. Next, an Al-40 atom % Ti film having a thickness of 1 μm was formed on a single-crystal Si substrate in the same manner as in Example 1 except that the Al-40 atom % Ti target in Example 3 was used instead of the Al-40 atom % Sc target in Example 1. At this time, the circumstance of sputtering of the Al-40 atom % Ti target was observed, under which the voltage was stable and the film was formed without confirming abnormal discharge or the like.

Comparative Example 1

A pure Al powder having a particle size of 150 μm or less and a purity of 3N and a Sc powder having a particle size of 150 μm or less and a purity of 2N were used, and after the amount of each powder was adjusted so that an Al-40 atom % Sc was obtained, the powders were mixed. Then, the Al-40 atom % Sc mixed powder was filled into a carbon mold for SPS sintering. Next, the mixed powder was enclosed in the mold and a punch or the like under preliminary pressurization at 10 MPa, and the mold filled with the mixed powder was set in an SPS device (model number: SPS-825, manufactured by SPS SYNTEX INC.). Then, sintering was performed under the sintering conditions of a sintering temperature of 550° C., a pressure of 30 MPa, a vacuum atmosphere at $8\times10^{-3}$ Pa or less as the atmosphere in a sintering device, and a holding time of a maximum sintering temperature of 0 hour. The Al-40 atom % Sc sintered body after the sintering was processed using a grinding machine, a lathe, or the like to produce an Al-40 atom % Sc target having a size of Φ50.8 mm×5 mmt in Comparative Example 1. Next, the chlorine content in the Al-40 atom % Sc target in Comparative Example 1 was measured in the same manner as in Example 1. The chlorine content was 146 ppm. The target included two kinds of intermetallic compounds of $Al_2Sc$ and AlSc, and had the first structure. Next, an Al-40 atom % Sc film having a thickness of 1 μm was formed on a single-crystal Si substrate in the same manner as in Example 1 except that the Al-40 atom % Sc target in Comparative Example 1 was used instead of the Al-40 atom % Sc target in Example 1. At this time, the circumstance of sputtering of the Al-40 atom % Sc target in Comparative Example 1 was observed, under which the voltage was unstable and abnormal discharge was confirmed. It is considered that the reason that the abnormal discharge occurred compared to Example 1 is that chlorine in the sputtering target was released by heating during film formation.

Comparative Example 2

An Al-30 atom % Sc target having a size of Φ50.8 mm×5 mmt in Comparative Example 2 was produced instead of the Al-40 atom % Sc target in Comparative Example 1 in the same manner as in Comparative Example 1 except that the amount of each powder was adjusted so that an Al-30 atom % Sc was obtained instead of the Al-40 atom % Sc. Next, the chlorine content in the Al-30 atom % Sc target in Comparative Example 2 was measured in the same manner as in Example 1. The chlorine content was 180 ppm. The target included two kinds of intermetallic compounds of $Al_2Sc$ and AlSc, and had the first structure. Next, an Al-30 atom % Sc film having a thickness of 1 μm was formed on a single-crystal Si substrate in the same manner as in Example 1 except that the Al-30 atom % Sc target in Comparative Example 2 was used instead of the Al-40 atom % Sc target in Example 1. At this time, the circumstance of sputtering of the Al-30 atom % Sc target in Comparative Example 2 was observed, under which the voltage was unstable and abnormal discharge was confirmed. It is considered that the reason that the abnormal discharge occurred compared to Example 2 is that chlorine in the sputtering target was released by heating during film formation.

Comparative Example 3

An Al-40 atom % Ti target having a size of Φ50.8 mm×5 mmt in Comparative Example 3 was produced in the same manner as in Comparative Example 1 except that the amount of each powder was adjusted using a pure Al powder having a particle size of 150 μm or less and a purity of 3N and a Ti powder having a particle size of 150 μm or less and a purity of 2N so that an Al-40 atom % Ti was obtained, instead of adjusting the amount of each powder using a pure Al powder having a particle size of 150 μm or less and a purity of 3N and a Sc powder having a particle size of 150 μm or less and a purity of 2N so that an Al-40 atom % Sc was obtained. Next, the chlorine content in the Al-40 atom % Ti target in Comparative Example 3 was measured in the same manner as in Example 1. The chlorine content was 216 ppm. The target included two kinds of intermetallic compounds of $Al_2Ti$ and AlTi, and had the first structure. Next, an Al-40 atom % Ti film having a thickness of 1 μm was formed on a single-crystal Si substrate in the same manner as in Example 1 except that the Al-40 atom % Ti target in Comparative Example 3 was used instead of the Al-40 atom % Sc target in Example 1. At this time, the circumstance of sputtering of the Al-40 atom % Ti target in Comparative Example 3 was observed, under which the voltage was unstable and abnormal discharge was confirmed. It is considered that the reason that the abnormal discharge occurred compared to Example 3 is that chlorine in the sputtering target was released by heating during film formation.

Comparative Example 4

Figure 8:
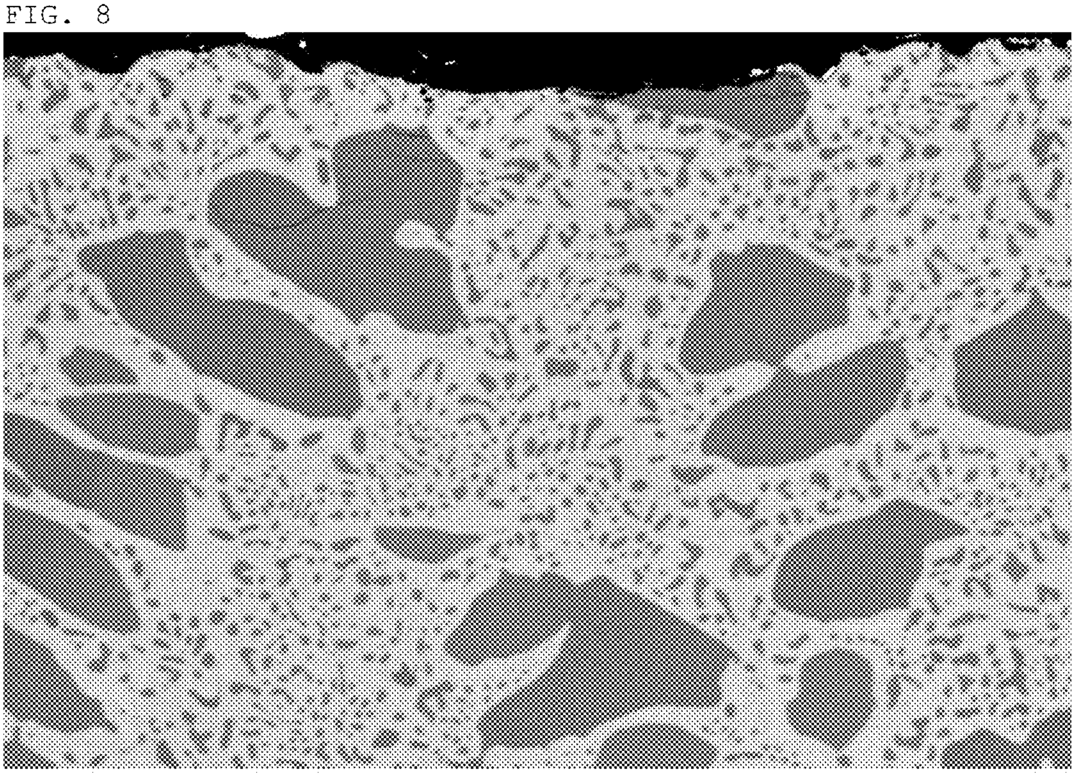
FIG. 8 is an image obtained by observing a surface of an Al—Sc target in Comparative Example 4 with an electron microscope.

An Al raw material having a purity of 4N and a Sc raw material having a purity of 3N were weighed so that an Al-40 atom % Sc raw material was obtained, and the obtained raw material was melted with an arc melting device (AME-300 manufactured by ULVAC, Inc.) to obtain a plate having a size of about 60 mm square×6 mm. Next, an attempt was made to produce a sputtering target having a size of Φ50.8 mm×5 mmt by machining this plate, but a chip was generated in the outer periphery of the plate in grinding, and a crack was generated in the plate in cutting by wire electric discharge machining, and as a result, no sputtering target was produced. In order to confirm the reason for generation of the crack, the cross section of the Al-40 atom % Sc target was observed using an electron microscope at a magnification of 500 times. FIG. 8 shows an image obtained by observation with the electron microscope. The image in FIG. 8 has a lateral side length of 250 μm. In FIG. 8, the discontinuous surface at the upper end is the processed surface of the target, and a crack has been confirmed inside the intermetallic compound. Therefore, it is considered that a crack is easily generated from a coarsened intermetallic compound particle as a starting point and the workability deteriorates.

Table 1 shows the kinds of elements added to Al, the amounts of the added elements, and the contents of chlorine in Examples 1 to 3 and Comparative Examples 1 to 3. Comparisons of Example 1 with Comparative Example 1, Example 2 with Comparative Example 2, and Example 3 with Comparative Example 3 have revealed that, as described above, abnormal discharge occurs in film formation unless the chlorine content is a predetermined value (100 ppm or less) even if the kind and the amount of the element added to Al are the same.

In Comparative Example 4, the plate was produced only with the melting method, and as a result, the obtained plate had a structure in which the intermetallic compound was coarsened. It is considered that the intermetallic compound was brittle for this reason, and a chip and a crack were generated during processing from the brittle intermetallic compound as a starting point. It is considered that in Example 1, granulation is performed by melting and rapid solidification to suppress coarsening of the structure of the intermetallic compound, and then a sputtering target is produced through a process called sintering to maintain a fine structure, resulting in suppression of a chip and a crack and improvement in workability. In the sputtering target in Example 1, the fine structure is maintained, so that the composition deviation depending on the location in the target is small. In order to confirm the composition deviation, the composition of the sputtering target was confirmed in the in-plane direction of the sputter surface and in the target thickness direction under (Condition 1). The composition was measured using EDS (manufactured by JEOL Ltd.). As a result, it was confirmed that the difference from the reference composition was within ±1% in each direction, and the composition deviation was small. In Comparative Example 4, it was found that the difference from the reference composition was not within ±3% at some measurement sites and the composition deviation was larger than that in Example 1.

TABLE 1

| | Added element | Addition amount (atom %) | Chlorine content (ppm) |
|---|---|---|---|
| Example 1 | Sc | 40 | 5.6 |
| Example 2 | Sc | 30 | 3.7 |
| Example 3 | Ti | 40 | 4.0 |
| Comparative Example 1 | Sc | 40 | 146 |
| Comparative Example 2 | Sc | 30 | 180 |
| Comparative Example 3 | Ti | 40 | 216 |

In Example 1, the fluorine content was measured using a mass spectrometer (model number: Element GD, manufactured by Thermo Fisher Scientific K. K.). The fluorine content was 5.5 ppm. In Comparative Example 1, the fluorine content was measured in the same manner. The fluorine content was 130 ppm.

In Example 1, the oxygen content was measured using a mass spectrometer (model number: ON836, manufactured by LECO Corporation). The oxygen content was 424 ppm. In Comparative Example 1, the oxygen content was measured in the same manner. The oxygen content was 2,993 ppm.

Example 4

Figure 9:
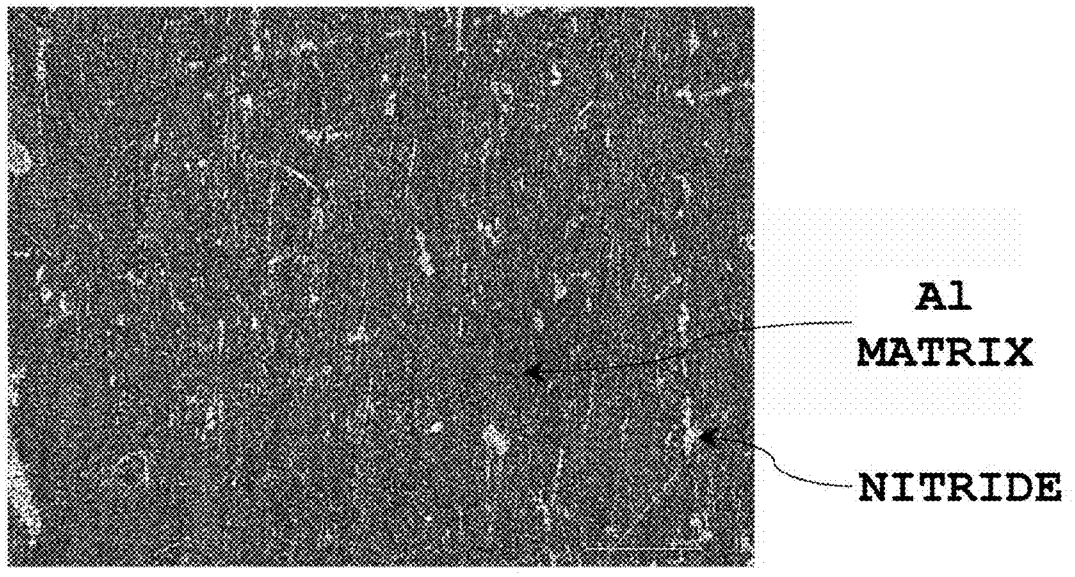
FIG. 9 is an image obtained by observing a surface of an Al—ScN target in Example 4 with a microscope.

A pure Al powder having a particle size of 150 μm or less and a purity of 4N and a ScN powder having a particle size of 150 μm or less and a purity of 3N were used, and after the amount of each powder was adjusted so that an Al-10 mol % ScN was obtained, the powders were mixed. Then, the Al-10 mol % ScN mixed powder was filled into a carbon mold for spark plasma sintering (hereinafter, also referred to as SPS sintering). Next, the mixed powder was enclosed in the mold and a punch or the like under preliminary pressurization at 10 MPa, and the mold filled with the mixed powder was set in an SPS device (model number: SPS-825, manufactured by SPS SYNTEX INC.). Then, sintering was performed under the sintering conditions of a sintering temperature of 550° C., a pressure of 30 MPa, a vacuum atmosphere at $8\times10^{-3}$ Pa or less as the atmosphere in a sintering device, and a holding time of a maximum sintering temperature of 0 hour. The Al-10 mol % ScN sintered body after the sintering was processed using a grinding machine, a lathe, or the like to produce an Al-10 mol % ScN target having a size of Φ50 mm×6 mmt. In producing the target, the workability was good, and molding into the target shape was possible. The surface of the produced target was observed with a microscope. FIG. 9 shows the observed image. The image in FIG. 9 has a lateral side length of 650 μm. It can be confirmed from FIG. 9 that Al occupies the most part as compared with ScN, and it is considered that an aluminum matrix is present on the basis of the continuously present Al. It is considered that the workability was obtained for this reason in producing the target. At this time, the target included two kinds of phases of Al and ScN, and had the fifth structure-2.

Next, the chlorine content in the Al-10 mol % ScN target in Example 4 was measured using a mass spectrometer (model number: Element GD, manufactured by Thermo Fisher Scientific K. K.). The chlorine content was 35.4 ppm.

Next, using the Al-10 mol % ScN target in Example 4, a film was formed on a Φ76.2 mm×5 mmt single-crystal Si substrate with a sputtering device (model number: MPS-6000-C4, manufactured by ULVAC, Inc.). The film formation condition was such that the sputtering device was evacuated until the degree of vacuum before film formation reached $5\times10^{-5}$ Pa or less, and then the pressure in the sputtering device was adjusted to 0.13 Pa using an Ar gas. Then, the sputtering power of the Al-10 mol % ScN target was adjusted to 150 W while the single-crystal Si substrate was heated to 300° C., and an Al-10 mol % ScN film having a thickness of 1 μm was formed on the single-crystal Si substrate. At this time, the circumstance of sputtering of the Al-10 mol % ScN target was observed, under which the voltage was stable and the film was formed without confirming abnormal discharge or the like.

REFERENCE SIGNS LIST

100, 200, 300, 400 Sputtering target
O Center
L, Q Imaginary crossing lines
S1 to S9 Measurement site in sputter surface
C1 to C9 Measurement site in cross section
P1 to P9 Measurement site in sputter surface
D1 to D9 Measurement site in cross section
1 Al-RE alloy particle
2 Al matrix
2, 2*a*, 2*b* Al-RE alloy crystal grain
4, 4*a*, 4*b* Aluminum crystal grain

The invention claimed is:

1. A sputtering target comprising:
aluminum and scandium;
wherein the sputtering target has a chlorine content of 3.7 to 30 ppm, a fluorine content of 100 ppm or less, an oxygen content of 500 ppm or less, a carbon content of 200 ppm or less, and a silicon content of 200 ppm or less,
wherein the sputtering target has a scandium content of 30 to 40 atom %, wherein the sputtering target has a structure in which an aluminum matrix phase is present,
wherein the sputtering target is a sintered body of a powder compact, and
wherein the sputtering target has a structure in which an aluminum scandium alloy is present in the aluminum matrix phase,
the structure in which a plurality of aluminum scandium alloy particles are attached to each other via the aluminum matrix phase,
each of the aluminum scandium alloy particles is an aggregate of aluminum scandium alloy crystal grains,
a boundary between an aluminum scandium alloy crystal grain and an adjacent aluminum scandium alloy crystal grain is a grain boundary,
the aluminum matrix phase is an aggregate of aluminum crystal grains, and
a boundary between an aluminum crystal grain and an adjacent aluminum crystal grain is a grain boundary.

2. The sputtering target according to claim 1, wherein the sputtering target has the fluorine content of 50 ppm or less.

3. The sputtering target according to claim 1, wherein the sputtering target has the oxygen content of 300 ppm or less.

4. The sputtering target according to claim 1, wherein an intermetallic compound including at least two elements selected from the aluminum, and at least one rare earth element, is present in the sputtering target.

5. The sputtering target according to claim 4, wherein the intermetallic compound comprises one, two, three, or four kinds of intermetallic compounds being present in the sputtering target.

6. The sputtering target according to claim 1, wherein at least one nitride of at least one element selected from the aluminum, and the at least one rare earth element, is present in the sputtering target.

7. The sputtering target according to claim 1, wherein the sputtering target has the carbon content of 100 ppm or less.

8. The sputtering target according to claim 1, wherein the sputtering target has the silicon content of 100 ppm or less.

* * * * *